(12) United States Patent
Ludden et al.

(10) Patent No.: US 9,703,411 B2
(45) Date of Patent: Jul. 11, 2017

(54) REDUCTION IN LATENCY BETWEEN USER INPUT AND VISUAL FEEDBACK

(75) Inventors: Christopher A. Ludden, Pittsford, NY (US); Thomas A. Mackin, Pittsford, NY (US); Shawn P. Day, San Jose, CA (US); David W. Gillespie, Los Gatos, CA (US)

(73) Assignee: Synaptics Incorporated, San Jose, CA (US)

( * ) Notice: Subject to any disclaimer, the term of this patent is extended or adjusted under 35 U.S.C. 154(b) by 1406 days.

(21) Appl. No.: 12/770,415

(22) Filed: Apr. 29, 2010

(65) Prior Publication Data

US 2010/0277505 A1 Nov. 4, 2010

Related U.S. Application Data

(60) Provisional application No. 61/174,403, filed on Apr. 30, 2009.

(51) Int. Cl.
*G09G 5/00* (2006.01)
*G06F 3/041* (2006.01)
(Continued)

(52) U.S. Cl.
CPC ............ *G06F 3/0416* (2013.01); *G06F 3/041* (2013.01); *G06F 3/048* (2013.01); *G06F 3/0486* (2013.01); *G06F 3/04886* (2013.01); *G09G 5/006* (2013.01)

(58) Field of Classification Search
CPC .......................... G09G 5/14; G09G 2340/125
(Continued)

(56) References Cited

U.S. PATENT DOCUMENTS

| 4,639,720 A | 1/1987 | Rympalski et al. |
| 4,680,577 A | 7/1987 | Straayer et al. |

(Continued)

FOREIGN PATENT DOCUMENTS

| CN | 2653589 Y | 11/2004 |
| CN | 1567140 A | 1/2005 |

(Continued)

OTHER PUBLICATIONS

Bier, Eric et al., "Toolglass and Magic Lenses: The See-Through Interface", *ACM-0-89791-601*, (1993),73-80.
(Continued)

*Primary Examiner* — Jin Ge
(74) *Attorney, Agent, or Firm* — Osha Liang LLP

(57) ABSTRACT

A system comprising a display screen configured for displaying images, a touch sensor having a sensing region, a host processing system and a touch screen control system. The touch screen control system comprising touch sensor control circuitry configured to operate the touch sensor and display control circuitry configured to operate the display screen. The display circuitry comprising a first memory configured to hold a primary image and a second memory configured to hold a secondary image and display refresh circuitry. The display refresh circuitry configured to update the display screen, and in response to the user input and without requiring intervention by the host processing system, generate a blended image comprising the primary image and the secondary image, and update the display screen with the blended image.

27 Claims, 10 Drawing Sheets

(51) Int. Cl.
    *G06F 3/0486* (2013.01)
    *G06F 3/0488* (2013.01)
    *G06F 3/048* (2013.01)

(58) Field of Classification Search
    USPC .......................................................... 345/634
    See application file for complete search history.

(56) References Cited

U.S. PATENT DOCUMENTS

| | | |
|---|---|---|
| 4,733,222 A | 3/1988 | Evans |
| 4,763,356 A | 8/1988 | Day, Jr. et al. |
| 4,806,709 A | 2/1989 | Evans |
| 5,250,929 A | 10/1993 | Hoffman et al. |
| 5,274,363 A | 12/1993 | Koved et al. |
| 5,305,017 A | 4/1994 | Gerpheide |
| 5,307,055 A | 4/1994 | Baskin et al. |
| 5,374,787 A | 12/1994 | Miller et al. |
| 5,420,936 A | 5/1995 | Fitzpatrick et al. |
| 5,457,289 A | 10/1995 | Huang et al. |
| 5,521,596 A | 5/1996 | Selker et al. |
| 5,543,588 A | 8/1996 | Bisset et al. |
| 5,543,591 A | 8/1996 | Gillespie et al. |
| 5,550,968 A | 8/1996 | Miller et al. |
| 5,559,961 A | 9/1996 | Blonder |
| 5,598,523 A | 1/1997 | Fujita |
| 5,600,800 A | 2/1997 | Kikinis et al. |
| 5,612,719 A | 3/1997 | Beernink et al. |
| 5,638,501 A | 6/1997 | Gough et al. |
| 5,666,113 A | 9/1997 | Logan |
| 5,714,978 A | 2/1998 | Yamanaka et al. |
| 5,724,069 A | 3/1998 | Chen |
| 5,729,219 A | 3/1998 | Armstrong et al. |
| 5,730,602 A | 3/1998 | Gierhart et al. |
| 5,748,184 A | 5/1998 | Shieh |
| 5,748,185 A | 5/1998 | Stephan et al. |
| 5,764,218 A | 6/1998 | Della et al. |
| 5,764,222 A | 6/1998 | Shieh |
| 5,790,104 A | 8/1998 | Shieh |
| 5,808,605 A | 9/1998 | Shieh |
| 5,812,118 A | 9/1998 | Shieh |
| 5,821,933 A | 10/1998 | Keller et al. |
| 5,825,352 A | 10/1998 | Bisset et al. |
| 5,831,664 A | 11/1998 | Wharton et al. |
| 5,835,079 A | 11/1998 | Shieh |
| 5,841,849 A | 11/1998 | Macor |
| 5,844,547 A | 12/1998 | Minakuchi et al. |
| 5,856,822 A | 1/1999 | Du et al. |
| 5,856,824 A | 1/1999 | Shieh |
| 5,870,083 A | 2/1999 | Shieh |
| 5,874,948 A | 2/1999 | Shieh |
| 5,880,411 A | 3/1999 | Gillespie et al. |
| 5,896,126 A | 4/1999 | Shieh |
| 5,907,327 A | 5/1999 | Ogura et al. |
| 5,923,307 A | 7/1999 | Hogle, IV |
| 5,943,052 A | 8/1999 | Allen et al. |
| 5,949,643 A | 9/1999 | Batio |
| 5,952,998 A | 9/1999 | Clancy et al. |
| 5,966,122 A | 10/1999 | Itoh |
| 6,002,395 A | 12/1999 | Wagner et al. |
| 6,005,549 A | 12/1999 | Forest |
| 6,028,959 A | 2/2000 | Wang et al. |
| 6,037,929 A | 3/2000 | Ogura et al. |
| 6,084,584 A | 7/2000 | Nahi et al. |
| 6,121,960 A | 9/2000 | Carroll et al. |
| 6,144,358 A | 11/2000 | Narayanaswamy et al. |
| 6,154,194 A | 11/2000 | Singh |
| 6,191,758 B1 | 2/2001 | Lee |
| 6,209,104 B1 | 3/2001 | Jalili |
| 6,211,856 B1 | 4/2001 | Choi et al. |
| 6,226,237 B1 | 5/2001 | Chan et al. |
| 6,252,563 B1 | 6/2001 | Tada et al. |
| 6,262,717 B1 | 7/2001 | Donohue et al. |
| 6,297,945 B1 | 10/2001 | Yamamoto |
| 6,298,146 B1 | 10/2001 | Ilan et al. |
| 6,298,147 B1 | 10/2001 | Ilan et al. |
| 6,304,261 B1 | 10/2001 | Shields et al. |
| 6,327,482 B1 | 12/2001 | Miyashita |
| 6,337,918 B1 | 1/2002 | Holehan |
| 6,346,935 B1 | 2/2002 | Nakajima et al. |
| 6,351,634 B1 | 2/2002 | Shin |
| 6,360,004 B1 | 3/2002 | Akizuki |
| 6,396,483 B1 | 5/2002 | Hiller |
| 6,400,836 B2 | 6/2002 | Senior |
| 6,408,301 B1 | 6/2002 | Patton et al. |
| 6,414,674 B1 | 7/2002 | Kamper et al. |
| 6,414,675 B1 | 7/2002 | Shen |
| 6,421,453 B1 | 7/2002 | Kanevsky et al. |
| 6,424,332 B1 | 7/2002 | Powell |
| 6,424,338 B1 | 7/2002 | Anderson |
| 6,429,846 B2 | 8/2002 | Rosenberg et al. |
| 6,466,202 B1 | 10/2002 | Suso et al. |
| 6,476,797 B1 | 11/2002 | Kurihara et al. |
| 6,496,122 B2 | 12/2002 | Sampsell |
| 6,504,530 B1 | 1/2003 | Wilson et al. |
| 6,509,847 B1 | 1/2003 | Anderson |
| 6,519,283 B1 | 2/2003 | Cheney et al. |
| 6,523,079 B2 | 2/2003 | Kikinis et al. |
| 6,535,749 B1 | 3/2003 | Iwata et al. |
| 6,538,880 B1 | 3/2003 | Kamijo et al. |
| 6,545,669 B1 | 4/2003 | Kinawi et al. |
| 6,559,830 B1 | 5/2003 | Hinckley et al. |
| 6,560,612 B1 | 5/2003 | Yamada et al. |
| 6,563,939 B1 | 5/2003 | Chai |
| 6,583,770 B1 | 6/2003 | Antila et al. |
| 6,587,093 B1 | 7/2003 | Shaw et al. |
| 6,639,584 B1 | 10/2003 | Li |
| 6,668,081 B1 | 12/2003 | Ilan et al. |
| 6,670,950 B1 | 12/2003 | Chin et al. |
| 6,686,931 B1 | 2/2004 | Bodnar |
| 6,718,518 B1 | 4/2004 | Plow et al. |
| 6,721,738 B2 | 4/2004 | Verplaetse et al. |
| 6,728,812 B1 | 4/2004 | Kato |
| 6,732,278 B2 | 5/2004 | Baird, III et al. |
| 6,735,695 B1 | 5/2004 | Gopalakrishnan et al. |
| 6,738,049 B2 | 5/2004 | Kiser et al. |
| 6,741,266 B1 | 5/2004 | Kamiwada et al. |
| 6,757,002 B1 | 6/2004 | Oross et al. |
| 6,765,557 B1 | 7/2004 | Segal et al. |
| 6,785,667 B2 | 8/2004 | Orbanes et al. |
| 6,792,480 B2 | 9/2004 | Chaiken et al. |
| 6,806,867 B1 | 10/2004 | Arruda et al. |
| 6,819,961 B2 | 11/2004 | Jacobs et al. |
| 6,822,640 B2 | 11/2004 | Derocher |
| 6,828,992 B1 | 12/2004 | Freeman et al. |
| 6,842,795 B2 | 1/2005 | Keller |
| 6,850,780 B1 | 2/2005 | Gioscia et al. |
| 6,871,782 B2 | 3/2005 | Keronen et al. |
| 6,874,683 B2 | 4/2005 | Keronen et al. |
| 6,882,299 B1 | 4/2005 | Allport |
| 6,882,337 B2 | 4/2005 | Shetter |
| 6,919,864 B1 | 7/2005 | Macor |
| 6,943,774 B2 | 9/2005 | Horiki |
| 6,954,804 B2 | 10/2005 | Lam et al. |
| 7,010,145 B1 | 3/2006 | Haruki et al. |
| 7,030,837 B1 | 4/2006 | Vong et al. |
| 7,030,860 B1 | 4/2006 | Hsu et al. |
| 7,054,965 B2 | 5/2006 | Bell et al. |
| 7,068,260 B2 | 6/2006 | Hill |
| 7,068,499 B2 | 6/2006 | Aisenberg |
| 7,075,540 B2 | 7/2006 | Yuasa |
| 7,154,453 B2 | 12/2006 | Numano |
| 7,219,368 B2 | 5/2007 | Juels et al. |
| 7,239,728 B1 | 7/2007 | Choi et al. |
| 7,280,087 B2 | 10/2007 | Williams et al. |
| 7,289,083 B1 | 10/2007 | Canova, Jr. |
| 7,292,206 B2 | 11/2007 | Numano |
| 7,295,199 B2 | 11/2007 | Foo et al. |
| 7,315,300 B2 | 1/2008 | Hill et al. |
| 7,324,093 B1 | 1/2008 | Gettemy et al. |
| 7,339,580 B2 | 3/2008 | Westerman et al. |
| 7,379,569 B2 | 5/2008 | Chikazawa et al. |
| 7,453,443 B2 | 11/2008 | Rytivaara et al. |
| 7,454,712 B2 | 11/2008 | Schultz |
| 7,730,401 B2 | 6/2010 | Gillespie et al. |

(56) References Cited

U.S. PATENT DOCUMENTS

| | | |
|---|---|---|
| 7,868,890 B2 | 1/2011 | Ludwin et al. |
| 7,907,779 B2 | 3/2011 | Kawamoto et al. |
| 7,924,271 B2 | 4/2011 | Christie et al. |
| 7,956,845 B2 | 6/2011 | Lee |
| 8,164,575 B2 | 4/2012 | Lin et al. |
| 8,203,527 B2 | 6/2012 | Low et al. |
| 8,237,667 B2 | 8/2012 | Krah |
| 8,390,578 B2 | 3/2013 | Chino |
| 8,416,197 B2 | 4/2013 | Feng et al. |
| 8,564,555 B2 | 10/2013 | Day et al. |
| 8,780,056 B2 | 7/2014 | Yamamoto et al. |
| 9,052,764 B2 | 6/2015 | Day et al. |
| 2001/0011308 A1 | 8/2001 | Clark et al. |
| 2001/0028366 A1 | 10/2001 | Ohki et al. |
| 2001/0029410 A1 | 10/2001 | Obradovich |
| 2001/0048743 A1 | 12/2001 | Machida et al. |
| 2001/0054968 A1 | 12/2001 | Yoshii et al. |
| 2002/0067346 A1 | 6/2002 | Mouton |
| 2002/0087225 A1 | 7/2002 | Howard |
| 2002/0130841 A1 | 9/2002 | Scott |
| 2002/0191029 A1* | 12/2002 | Gillespie et al. ............. 345/810 |
| 2003/0006942 A1 | 1/2003 | Searls et al. |
| 2003/0071851 A1 | 4/2003 | Unger et al. |
| 2003/0074566 A1 | 4/2003 | Hypponen |
| 2003/0197687 A1* | 10/2003 | Shetter ............................ 345/173 |
| 2004/0099400 A1 | 5/2004 | Tsuzuki et al. |
| 2004/0119763 A1 | 6/2004 | Mizobuchi et al. |
| 2004/0230807 A1 | 11/2004 | Baird, III et al. |
| 2004/0239646 A1 | 12/2004 | Wang |
| 2005/0024341 A1 | 2/2005 | Gillespie et al. |
| 2005/0099400 A1* | 5/2005 | Lee ................................ 345/173 |
| 2005/0146511 A1 | 7/2005 | Hill et al. |
| 2005/0184993 A1 | 8/2005 | Ludwin et al. |
| 2005/0185002 A1 | 8/2005 | Kitsugi et al. |
| 2005/0248543 A1 | 11/2005 | North et al. |
| 2006/0066601 A1* | 3/2006 | Kothari et al. ................ 345/204 |
| 2006/0250375 A1 | 11/2006 | Liou et al. |
| 2006/0262146 A1 | 11/2006 | Koivisto et al. |
| 2007/0016876 A1 | 1/2007 | Schultz |
| 2007/0177801 A1* | 8/2007 | Kawamoto et al. .......... 382/187 |
| 2007/0285428 A1 | 12/2007 | Foster et al. |
| 2008/0042978 A1 | 2/2008 | Perez-Noguera |
| 2008/0055256 A1* | 3/2008 | Kwong et al. ................. 345/173 |
| 2008/0088592 A1 | 4/2008 | Fry |
| 2008/0158177 A1 | 7/2008 | Wilson et al. |
| 2008/0165133 A1 | 7/2008 | Blumenberg et al. |
| 2008/0165140 A1* | 7/2008 | Christie et al. ............... 345/173 |
| 2008/0180399 A1 | 7/2008 | Cheng |
| 2008/0225009 A1 | 9/2008 | Wang |
| 2008/0309636 A1 | 12/2008 | Feng et al. |
| 2008/0313568 A1 | 12/2008 | Park et al. |
| 2009/0051660 A1 | 2/2009 | Feland, III et al. |
| 2009/0191029 A1 | 7/2009 | Lim et al. |
| 2009/0207154 A1 | 8/2009 | Chino |
| 2009/0251427 A1 | 10/2009 | Hung et al. |
| 2009/0251430 A1 | 10/2009 | Hung et al. |
| 2009/0309851 A1 | 12/2009 | Bernstein |
| 2009/0315826 A1 | 12/2009 | Lin et al. |
| 2009/0322410 A1 | 12/2009 | David et al. |
| 2009/0327978 A1 | 12/2009 | Hamadene et al. |
| 2010/0059295 A1 | 3/2010 | Hotelling et al. |
| 2010/0060593 A1* | 3/2010 | Krah .............................. 345/173 |
| 2010/0085280 A1 | 4/2010 | Lambert et al. |
| 2010/0110029 A1 | 5/2010 | Yamamoto et al. |
| 2010/0115303 A1* | 5/2010 | Stedman et al. .............. 713/320 |
| 2010/0122195 A1* | 5/2010 | Hwang ......................... 715/769 |
| 2010/0277505 A1 | 11/2010 | Ludden et al. |
| 2011/0012856 A1 | 1/2011 | Maxwell et al. |
| 2014/0327636 A1 | 11/2014 | Day et al. |

FOREIGN PATENT DOCUMENTS

| | | |
|---|---|---|
| CN | 1614545 | 5/2005 |
| CN | 1734392 A | 2/2006 |
| DE | 19654684 | 7/1998 |
| EP | 262991 | 4/1988 |
| EP | 546704 | 6/1993 |
| EP | 660218 | 6/1995 |
| EP | 725331 | 8/1996 |
| EP | 807879 | 11/1997 |
| EP | 896308 | 2/1999 |
| EP | 898223 | 2/1999 |
| EP | 911720 | 4/1999 |
| EP | 984351 | 3/2000 |
| EP | 1003130 A2 | 5/2000 |
| EP | 1531387 A2 | 5/2005 |
| GB | 2302429 | 1/1997 |
| GB | 2338148 | 12/1999 |
| JP | 61234419 | 10/1986 |
| JP | 62078621 | 4/1987 |
| JP | 02127720 | 5/1990 |
| JP | 05341877 | 12/1993 |
| JP | 06051907 | 2/1994 |
| JP | 06241718 | 9/1994 |
| JP | 07295747 | 11/1995 |
| JP | 08036479 | 2/1996 |
| JP | 09026832 | 1/1997 |
| JP | 09101842 | 4/1997 |
| JP | 10-357263 | 12/1998 |
| JP | 11-079000 | 3/1999 |
| JP | 2000339097 | 12/2000 |
| KR | 10-0593982 | 6/2006 |
| KR | 100593982 | 6/2006 |
| KR | 10-2009-029518 | 3/2009 |
| KR | 1020090029518 | 3/2009 |
| WO | WO-9105327 | 4/1991 |
| WO | WO-9512843 | 5/1995 |
| WO | WO-9641329 | 12/1996 |
| WO | WO-9722107 | 6/1997 |
| WO | WO-9744946 | 11/1997 |
| WO | WO-9745794 | 12/1997 |
| WO | WO-9921077 | 4/1999 |
| WO | WO-9931649 | 6/1999 |
| WO | WO-0127868 | 4/2001 |
| WO | 02/052506 A1 | 7/2002 |

OTHER PUBLICATIONS

"Users Guide to QuBit", *QuVis, Inc., Edition 1.0*, (1999),1-58.

Lehrbaum, R. et al., "Overview of Gateways "Connected Home" Initiative", Http://www.linuxdevices.com/articles/AT3155528116.html, (Nov. 15, 2000),1-4.

Tsukada, Y. et al., "Layered Touch Panel: The input device with two touch panel layers", *Conference on Human Factors in computing systems CHI '02 extended abstracts on Human Factors in computing systems*, (2002),1-2.

Neale, R. "Laptops and notepads—the arrival of the second display", *Electronic Engineering*, (Oct. 2000),9-10.

"Section II. Memory Standard Overviews", Altera Inc., http://www.altera.com/literature/hb/external-memory/emi intro over.pdf, (Jan. 2010).

"Creating Low-cost Intelligent Display Modules with an FPGA and Embedded Processor", Altera, Inc., http://www.altera.com/literature/wp/wp-01074-creating-low-cost-intelligent-display-modules-with-fpga.pdf., (2008).

"Implementing a Cost-Effective Human-Machine Interface for Home Appliances", Altera, Inc., http://www.altera.com/literature/wp/wp-01083-cost-effective-hmi-home-appliances.pdf, (Jul. 2009).

Kim, H. et al., "A Mobile-Display-Driver IC Embedding a Capacitive-Touch-Screen Controller System", *ISSCC 2010 Session 6 Displays & Biomedical Devices, 6.1 Samsung Electronics*, Yongin, Korea; 978-1-4244-6034-2/10 (https://submissions.miracd.com/ISSCC2010/WebAP/PDF/AP Session6.pdf), (2010).

"Using FPGAs to Render Graphics and Drive LCD Interfaces", Altera, Inc., http://www.altera.com/literature/wp/wp-01100-graphic-lcd-display.pdf, (Apr. 2009).

Liu Xi, Office Action for Chinese Application No. 201080019231.7, 9 pages, Dec. 11, 2012 (Dec. 11, 2012).

(56) References Cited

OTHER PUBLICATIONS

Altera Corporation, "Creating Low-Cost Intelligent Display Modules With an FPGA and Embedded Processor", http://www.altera.com/literature/wp/wp-01074-creating-low-cost-intelligent-display-modules-with-fpga.pdf Ver. 1.0., (Sep. 2008),1-5.

Altera Corporation, "Implementing a Cost-Effective Human-Machine Interface for Home Appliances", http://www.altera.com/literature/wp/wp-01083-cost-effective-hmi-home-appliances.pdf Ver. 2.0, (Jul. 2009),1-8.

Altera Corporation, "Using FPGAs to Render Graphics and Drive LCD Interfaces", http://www.altera.com/literature/wp/wp-01100-graphic-lcd-display.pdf Ver. 1.0, (Apr. 2009),1-9.

Altera Corporation, "Memory Standard Overviews", http://www.altera.com/literature/hb/external-memory/emi intro over.pdf, (Jan. 2010),1-32.

Kim, et al., "ISSCC 2010 Session 6 Displays & Biomedical Devices, 6.1", https://submissions.miracd.com/ISSCC2010/WebAP/PDF/AP Session6.pdf. (2010),Section 6.1.

ISA/KR, International Search Report and Written Opinion for International Application No. PCT/US2010/033051, 9 pages, Nov. 26, 2010 (Nov. 26, 2010).

Leineweber, Hubert, Extended Search Report for European Application No. 10 77 0371, 11 pages, Oct. 14, 2013 (Oct. 14, 2013).

Leineweber, Hubert, Extended Search Report for European Application No. 10 77 0378, 12 pages, Oct. 14, 2013 (Oct. 14, 2013).

Office Action, U.S. Appl. No. 14/050,191, mailed Apr. 9, 2014, 17 pages.

Office Action Search Report, CN Application No. 201080019329.2, mailed Nov. 22, 2013, 2 pages.

Office Action, U.S. Appl. No. 14/050,191, mailed Dec. 3, 2013, 39 pages.

Office Action, U.S. Appl. No. 14/050,191, mailed Jun. 30, 2014, 6 pages.

Office Action, U.S. Appl. No. 14/050,191, mailed Aug. 27, 2014, 22 pages.

Office Action, U.S. Appl. No. 14/298,807 mailed Oct 8, 2015, 27 pages.

Office Action, U.S. Appl. No. 14/298,807, mailed Jul. 28, 2015, 46 pages.

"The iPod touch—Features Guide", Apple Corporation, May 10, 2008, 1-98.

Mossberg, et al., "The iPhone Is a Breakthrough Handheld Computer", http://allthingsd.com/20070626/the-iphone-is-breakthrough-handheld-computer/, Jun. 26, 2007, 1-5.

\* cited by examiner

300

Update the Display Screen with ones of Images Processed by and Received from a Host Processing System, wherein the Host Processing System is Configured for Primary Processing of ones of Images for Display on the Display Screen
310

↓

Hold a Primary Image Received from the Host Processing System in a First Memory
320

↓

Hold a Secondary Image in a Second Memory
330

↓

In Response to Sensing User Input in a Sensing Region Overlapping an Active Area of the Display Screen: Autonomously Generate a Blended Image Comprising the Primary Image and the Secondary Image; and Autonomously Update the Display Screen with the Blended Image
340

FIG. 3

REDUCTION IN LATENCY BETWEEN USER INPUT AND VISUAL FEEDBACK

CROSS REFERENCE TO RELATED APPLICATIONS

This application claims priority to and benefit of U.S. Provisional Patent Application 61/174,403 filed Apr. 30, 2009, which is incorporated by reference in its entirety herein.

BACKGROUND

Electronic devices are ubiquitous in today's society. As the technology of electronic devices advances, the number of integrated functions enabled on such devices also increases. As an example, many of today's electronic devices include the ability to display information to users and to receive touch based input from users. In order to receive and process touch based input, many current electronic devices utilize capacitive sensing devices in combination with display devices. Typically such capacitive sensing devices process user input received from, for example, one or more fingers, styli, or other object in a sensing region of the capacitive sensor device.

However, as the number of integrated functions increases on electronic devices, the processing burdens imposed on their host processors also increase. (As an example, when an electronic device includes both a display and a capacitive sensor device, the host processor of the electronic device handles processing for both components.) As a result, the electronic devices may suffer from performance shortcomings due to the burden placed on their host processors. For example, a delay between user input and visual feedback to the user may arise because of host processor-induced latency.

As a result of such shortcomings, users may become frustrated and/or confused. User frustration or confusion may lead to user dissatisfaction or cause the users to perform repetitive and/or unnecessary user input actions which further burden the host processors. Additionally, as the number of the functions integrated onto electronic devices increases, power consumption also increases.

Taking mobile devices as a specific example, the use of mobile devices often require loading, displaying and controlling large amounts of data including pictures, web pages, maps, text and non-textual documents, etc. In some mobile devices, there is often a delay between user input (e.g. taps, double-taps, scroll commands, etc.) and visual feedback to the user.

BRIEF DESCRIPTION OF THE DRAWINGS

FIG. 3 illustrates an example method for operating a touch screen control system to display images on a display screen, in accordance with an embodiment of the present invention.

The drawings referred to in this description should be understood as not being drawn to scale except if specifically noted.

DESCRIPTION OF EMBODIMENTS

Reference will now be made in detail to embodiments of the present invention, examples of which are illustrated in the accompanying drawings. While the invention will be described in conjunction with various embodiment(s), it will be understood that the descriptions are not intended to limit the present invention to these embodiments. On the contrary, the present invention is intended to cover alternatives, modifications and equivalents, which may be included within the spirit and scope of the various embodiments as defined by the appended claims.

Furthermore, in the following description of embodiments, numerous specific details are set forth in order to provide a thorough understanding of the present invention. However, the present invention may be practiced with a subset or without these specific details. In other cases, well known methods, procedures, components, and circuits have not been described in detail as not to unnecessarily obscure aspects of the present embodiments.

Description of Components

Figure 1:
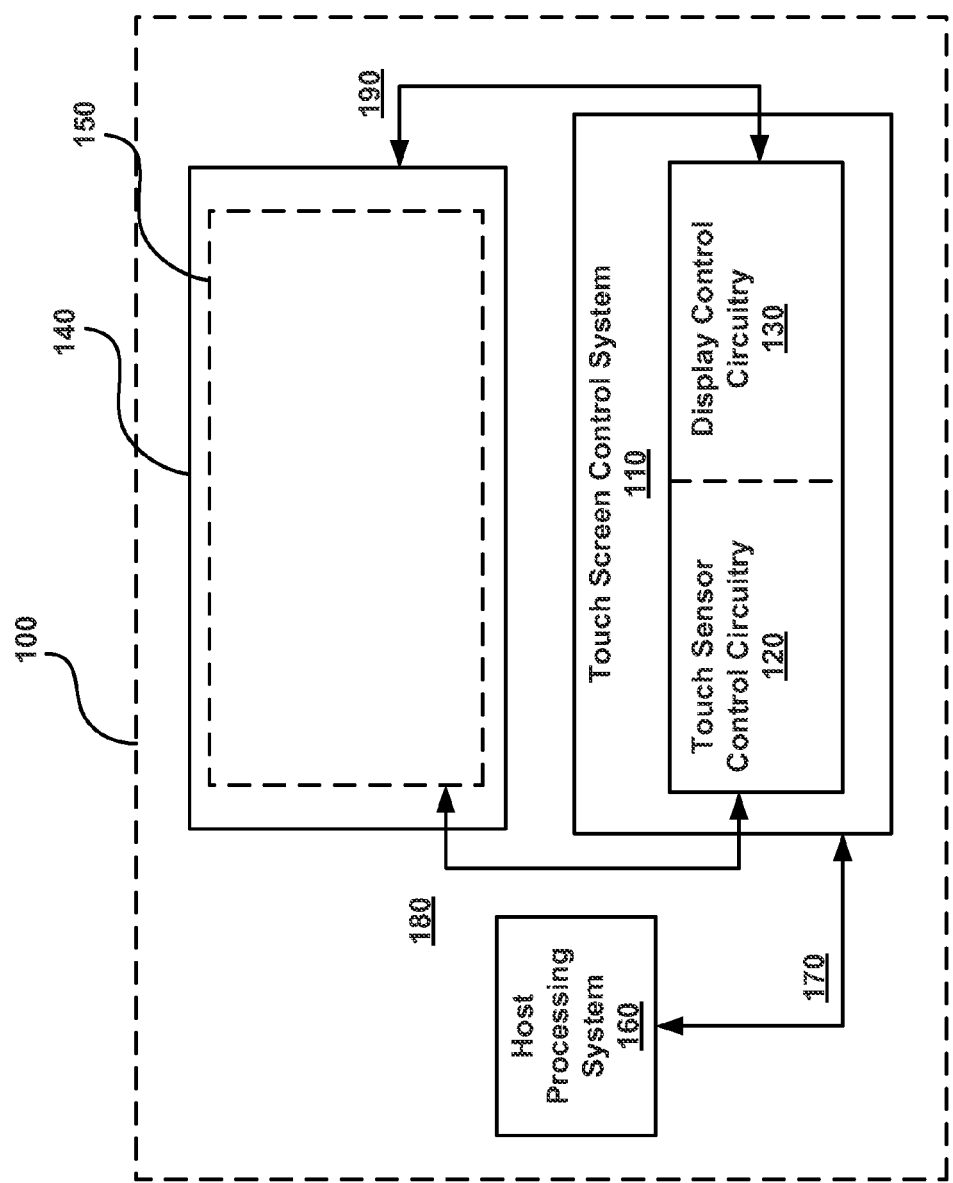
FIG. 1 illustrates an example of an electronic device, in accordance with an embodiment of the present invention.

FIG. 1 depicts electronic device 100, in accordance with an embodiment of the present invention. Electronic device 100 includes touch screen control system (TSCS) 110 (which includes touch sensor control circuitry (TSCC) 120 and display control circuitry (DCC) 130), display screen 140, touch sensor 150 and host processing system 160, all of which will be described in detail later. Connecting arrows 170, 180, and 190 indicate that, in some embodiments, host processing system 160 has bidirectional interactions with TSCS 110, TSCC 120 has bidirectional interactions with touch sensor 150, and DCC 130 has bidirectional interactions with display screen 140. In other embodiments, some or all of these interactions may be unidirectional.

In various embodiments, electronic device 100 is any electronic device that comprises the aforementioned components and functions (e.g., receives user input and provides visual feedback to the user). For example, electronic device 100 may comprise: personal computers (e.g. desktop computers, laptop computers, portable computers, workstations, personal digital assistants, and video game machines), communication devices (e.g. wireless phones, pagers, and other messaging devices), media devices that record and/or play various forms of media (e.g. televisions, cable boxes, music players, digital picture frames, video players, digital cameras, and video cameras), peripherals to larger systems (e.g. printers, keyboards, and remote controls), white goods (e.g. appliances), automotive devices, industrial devices, electronic toys, and any other electrical device that could benefit from having a sophisticated user interface that does not significantly burden its host processing system.

In some embodiments, elements of electronic device 100 are physically unified, and TSCS 110, display screen 140, touch sensor 150, and host processing system 160 are all disposed within a common housing. For example, electronic device 100 may be a handheld computing system.

Display screen 140 is configured for displaying images. Display screen 140 may be a cathode ray tube (CRT), a liquid crystal display (LCD), an organic light emitting diode (OLED) display, an electroluminescent display, or any other type of display screen suitable to be integrated in an electronic device. Additionally, in some embodiments, electronic device 100 includes a backlight (not shown) to enhance visibility of images on display screen 140.

Touch sensor 150 is shown in FIG. 1 as a dotted rectangle overlapping display screen 140. However, in various embodiments, the actual physical sensor components of touch sensor 150 may be located inside or outside of the dotted rectangle.

Although called a "touch" sensor, embodiments of touch sensor 150 may respond to contact or non-contact user input in their respective sensing regions. The sensing region overlaps with an active area of display screen 140. The active area is the region in which electronic images may be displayed by display screen 140. It will be understood that some embodiments of display screen 140 may include regions, such as border regions, in which electronic images may not be displayed.

Embodiments of touch sensor 150 may demark their sensing regions using surfaces. During operation, touch sensor 150 is operated to detect one or more input objects in the sensing region, for sensing user input. "Sensing region" as used herein is intended to broadly encompass any space where touch sensor 150 is able to reliably detect an input object. In some embodiments of touch sensor 150, the sensing region, extends from a surface of touch sensor 150 in one or more directions into space until decreased signal-to-noise prevents accurate object detection. This distance may be on the order of less than a millimeter, millimeters, centimeters, or more, and may vary significantly with the type of sensing technology used and the accuracy desired. Thus, embodiments may require contact with the surface, either with or without applied pressure, while others do not. Accordingly, in some embodiments, the planarity, size, shape and exact locations of the particular sensing regions vary widely from embodiment to embodiment.

Touch sensor 150 may utilize any combination of sensor components and sensing technologies. As several non-limiting examples, touch sensor 150 may use capacitive, elastive, resistive, inductive, surface acoustic wave, optical, or other techniques. Data gathered by touch sensor 150 may be used to determine the presence, location and/or motion of one or more fingers, styli, and/or other objects.

In some resistive implementations of touch sensor 150, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of touch sensor 150, one or more sensor elements pick up loop currents induced by a resonating coil or pair of coils. Some combination of the magnitude, phase, and frequency of the currents may be used to determine positional information.

In some capacitive implementations of touch sensor 150, voltage or current is applied to create an electric field. Nearby input objects cause changes in the electric field, and produce detectable changes in capacitive coupling that may be detected as changes in voltage, current, or the like. These changes in capacitive coupling may be used to determine positional information.

Some capacitive implementations utilize arrays or other patterns of capacitive sensor electrodes to create electric fields. Some capacitive implementations utilize resistive sheets, which may be uniformly resistive.

Some capacitive implementations utilize "self capacitance" (also "absolute capacitance") sensing methods based on the capacitive coupling between sensor electrodes and free space. In one implementation, an absolute capacitance sensing method operates by modulating sensor electrodes with respect to a reference voltage (e.g. system ground), and by detecting the capacitive coupling between sensor electrodes and input objects.

Some capacitive implementations utilize "mutual capacitance" (also "transcapacitance") sensing methods based on the capacitive coupling between sensor electrodes. In one implementation, a transcapacitive sensing method operates by detecting the capacitive coupling between one or more transmitting electrodes and one or more receiving electrodes. Transmitting sensor electrodes may be substantially modulated relative to a reference voltage (e.g. system ground) to facilitate transmission, and receiving sensor electrodes may be held substantially constant relative to the reference voltage to facilitate receipt. Sensor electrodes may be dedicated transmitters and receivers, or may transmit as well as receive.

Host processing system 160 may be utilized for processing of images for display on display screen 140. For example, to display a video on display screen 140 in some embodiments, host processing system 160 provides image data for the video frames, such that display screen 140 may update with the different frames and present the video to users.

In some embodiments, host processing system 160 is configured for primary processing of the images for display on display screen 140. That is, host processing system 160 is configured to perform a majority of the processing of images for display on display screen 140. In other words, in some embodiments, electronic device 100 is designed such that a majority of image data to be display on display screen 140 would pass through and be processed by host processing system 160. However, in some embodiments, host processing system 160 is not configured for primary processing of the images for display on display screen 140, and host processing system 160 does little or no processing of the images for display on display screen 140.

A "primary image" is an image processed by host processing system 160 and held in a memory of TSCS 110 (e.g. first memory 131 discussed below) for primary display on display screen 140. The primary image may be static or may change over a period of time. In some embodiments, the primary image is modified, or replaced entirely by host processing system 160, by TSCS 110, or by both.

An image is "updated" in memory when the data representing the image is changed in part or in whole. In some embodiments, host processing system 160 or TSCS 110 changes bits associated with the changed portion(s), or writes new image data to replace what is stored in the memory.

An image is "updated" on display screen 140 when the display of the image by display screen 140 is changed in part or in whole. In some embodiments, TSCS 110 changes one or more portions of an image displayed on display screen 140, or replaces the image displayed on display screen 140 entirely.

Display screen 140 is "refreshed" when what is displayed is redrawn, even if the image drawn is identical to the image already shown. Refreshing display screen 140 with the same image as already displayed may help reduce flicker or otherwise help maintain the displayed image. Thus, display screen 140 may be refreshed when it is not updated.

"Display image update rate" as used herein generally indicates the rate at which the image on display screen 140 is updated. For example, some typical display image update rates associated with animation or video of reasonable quality include 15, 24, and 30 frames per second. As another example, a typical display image update rate associated with quality user interface experience is 60 frames per second.

"Image data update rate" as used herein generally indicates the rate at which image data is updated in a memory of TSCS 110 (e.g. first memory 131 described below. The updating of image data in the memory of TSCS 110 may be by host processing system 160, TSCS 110, or some other element.

"Display refresh rate" is used to indicate the rate at which the pixels on the display are repetitively scanned to maintain a quality-image on the display. For example, some typical refresh rates for conventional display screens include 60 Hz for LCDs, 60-85 Hz for CRTs, and the like.

Different embodiments of the present invention may have maximum display refresh rates that are slower than, equal to, or faster than their maximum image data update rates. Similarly, different embodiments of the present invention may have maximum display refresh rates that are slower than, equal to, or faster than their maximum display image update rates.

In various embodiments, in accordance with the present invention, TSCC 120 and DCC 130, and optionally other parts of TSCS 110, function collectively to operate touch sensor 150 to detect user input in the sensing region and to operate display screen 140 to display images in response to the user input, without requiring intervention by host processor 160. In other words, TSCC 120 and DCC 130, and optionally with other parts of TSCS 110, autonomously operate touch sensor 150 and display screen 140, without real-time host image processing performed or direction provided directly in response to the user input in the sensing region. TSCC 120 and DCC 130 (and optionally with other parts of TSCS 110) may perform these functions according to hardwired rules or with rules previously provided by host processing system 160.

In some embodiments, host processing system 160 is sometimes in a low-power state (including potentially being off) while TSCS 110 is operating autonomously. In some embodiments, host processing system 160 sometimes performs processing or provides instructions not directly related to updating display screen 140 or not directly in response to the user input.

In embodiments of electronic device 100, such autonomous operation reduces or eliminates the shortcomings as describe above. For example, such autonomous operation may reduce latency, reduce response time variability, and increase responsiveness to user input. These improvements can increase a user's sense of ease, comfort, or confidence in the operation of electronic device 100.

In embodiments of electronic device 100, such autonomous operation reduces the processing required of host processing system 160, and thus can reduce power consumption by electronic device 100. For example, host processing system 160 may enter a low power state while the updating of images on display screen 140 is done locally by TSCS 110. Examples of low power states include off states, sleep states, and states where host processing system 160 expends less processing power.

In addition, in embodiments of electronic device 100, such autonomous operation reduces the maximum image data update rate that host processing system 160 needs to support while still providing smooth and responsive feedback. For example, TSCS 110 may be configured such that it can produce images and update display screen 140 at a higher rate than host processing system 160 can update the primary image held in a memory of TSCS 110 (e.g. memory 131 described below). In some embodiments, TSCS 110 is able to produce updated displays at 60 Hz or higher in response to user input. This offloads host processing system 160 such that host processing system 160 may be configured with a maximum update rate lower than 60 Hz (e.g., 30 Hz) without significant detrimental impact on user experience. This also allows electronic device 100 to have relaxed requirements for communications bandwidth (e.g., serial link requirements), other performance characteristics, and the like. The relaxed requirements may provide greater design choice and cost savings.

Some embodiments of electronic device 100 are able to update display screen 140 faster than host processing system 160 can update the primary image. That is, some embodiments of electronic device 100 support a display image update rate greater than the image data update rate associated with host processing system 160. For example, in some embodiments, TSCS 110 is configured to be able to generate updated images and update the display screen at a faster rate than if the host processing system 160 performed the image processing. This TSCS 110 functionality supports the greater display image update rate in those systems.

Regardless of the maximum update rates, in operation, the image data update rate utilized may be significantly lower than the display screen update rate utilized. For example, TSCS 110 may blend images to provide visual feedback during a function such as a drag function. The primary image may be the "background" over which the item dragged moves, and the image data held in memory for the primary image may change infrequently or not at all during the drag function. Thus, a lower image data update rate is utilized (compared to the display image update rate used) by some embodiments.

The image of the item dragged may stay static in memory during the drag function. However, the blending coordinates associated with the image of the item dragged may change during the drag function. TSCS 110 updates display screen 140 with autonomously generated images blending the image of the item dragged at locations specified by the blending coordinates, effectively moving the dragged item relative to the primary image or display screen 140, or both. Thus, a higher display image update rate is utilized (compared to the image data update rate used).

In various embodiments, TSCC 120 (optionally with other parts of TSCS 110) functions to operate touch sensor 150 to obtain measurements that enable the determination of user input characteristics such as number and motion of input objects. Such measurement(s) are utilized by TSCS 110, in some embodiments, to determine positional information with respect to a user input relative to the sensing region of touch sensor 150.

The term "positional information" as used herein is intended to broadly encompass absolute and relative position-type information, including motion in one or more directions and also other types of spatial-domain information such as velocity, acceleration, and the like. Various forms of positional information may also include time history components, as in the case of gesture recognition and the like. The positional information from TSCS 110 may be used for facilitating a full range of interface actions, including use of the proximity sensor device as a pointing device for cursor control, scrolling, and other functions.

Elements of TSCS 110 (e.g., TSCC 120 and DCC 130) may be implemented as part or all of one or more integrated circuits and/or discrete components physically separate from host processing system 160. That is, TSCS 110 may comprise part or all of one IC that is separate from host processing system 160. Similarly, TSCS 110 may comprise parts or all of multiple ICs that are separate from host processing system 160.

In some embodiments, TSCC 120 and DCC 130 do not share circuitry. That is, circuitry used to operate the touch sensor is not used to operate the display screen, and vice versa. In some embodiments, TSCC 120 and DCC 130 do share circuitry, such that circuitry of TSCC 120 is also circuitry of DCC 130. For example, circuitry specific to operation of touch sensor 150 and circuitry specific to operation of display screen 140 may be physically coupled to a same processing unit that performs computations for both touch sensor and display operation. As another example, TSCC 120 and DCC 130 may hold data in the same memory.

Figure 2:
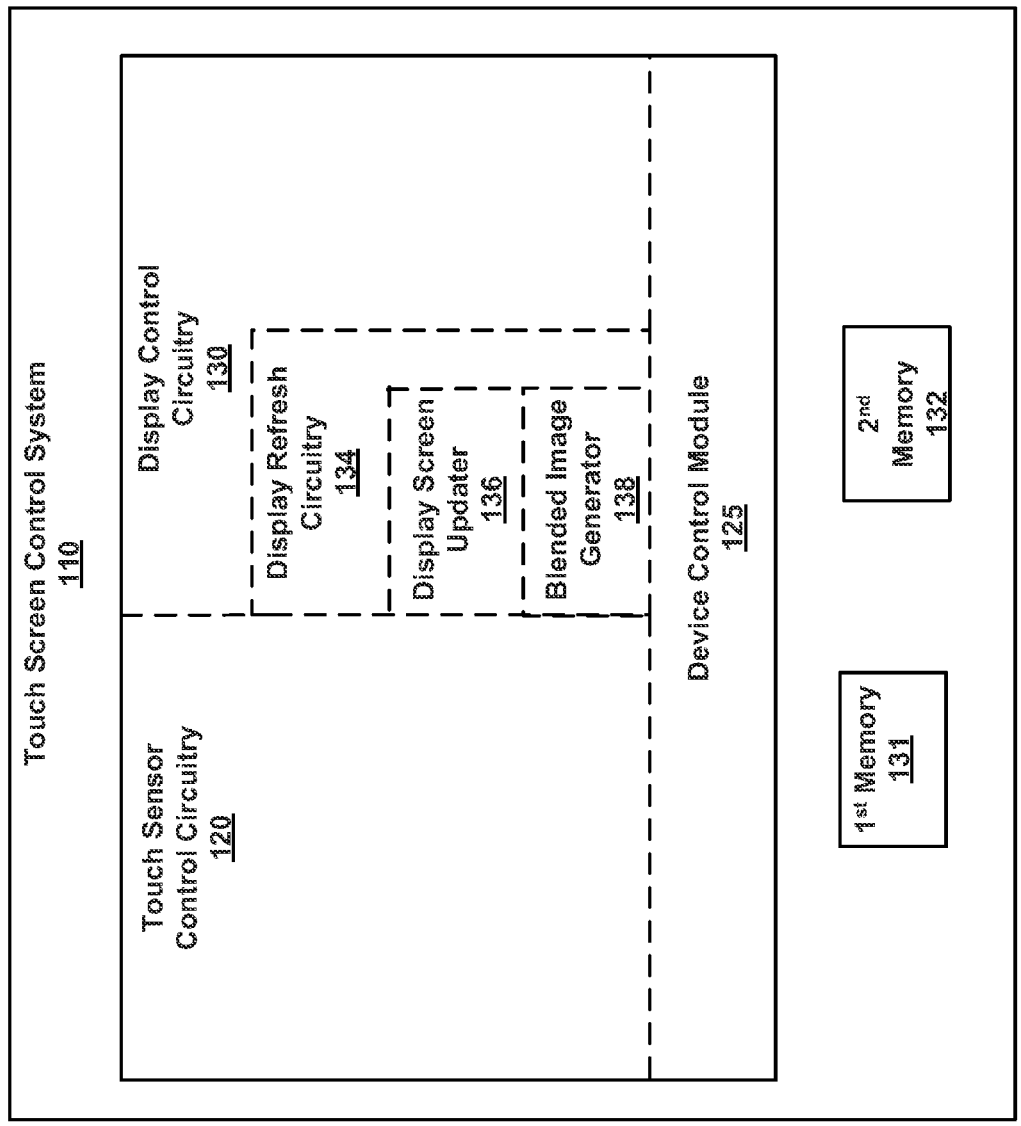
FIG. 2 illustrates an example of a touch screen control system, in accordance with an embodiment of the present invention.

A detailed description of the structure and components of FIG. 2 is now provided below.

FIG. 2 depicts touch screen control system (TSCS) 110, in accordance with an embodiment of the present invention. TSCS 110 includes touch screen control circuitry (TSCC) 120, display control circuitry (DCC) 130, first memory 131 and second memory 132. In some embodiments, DCC 130 optionally includes display refresh circuitry 134, which optionally includes display screen updater 136 and blended image generator 138. Also, in some embodiments, TSCS 110 optionally includes device control module 125.

As presented above, TSCS 110 and its associated components are implemented as part or all of one or more integrated circuits and/or discrete components. Embodiments of TSCS 110 in accordance to the present invention are well suited to having discrete components, such as ICs that each solely comprises TSCC 120 or DCC 130, and the like. Embodiments of TSCS 110 in accordance to the present invention are also well suited to being integrated in a single IC, such as one IC that forms parts or all of TSCC 120 and DCC 130.

Also as presented above, in various embodiments, elements of TSCS 110 share common circuit elements. For example, TSCC 120 and DCC 130 may operate using some of the same circuitry.

In some embodiments, first memory 131 and second memory 132 are disposed as physically separate memory structures, as shown in FIG. 2. However, embodiments in accordance to the present invention are also well suited to have first memory 131 and second memory 132 that are partitions of the same memory structure. In various embodiments, first memory 131 and second memory 132 are either contiguous or non-contiguous. In various embodiments, first memory 131 and second memory 132 are comprised of volatile memory (e.g. various types of random access memory (RAM)), or non-volatile memory (e.g. various types of flash or read-only memory (ROM)), or any combination thereof.

Further, in some embodiments, second memory 132 is smaller in memory capacity than first memory 131. In some embodiments, first memory 131 is a frame buffer.

Referring still to FIG. 2, in some embodiments, display refresh circuitry 134 includes display screen updater 136 and blended image generator 138. As will described in the operational description below, display screen updater 136 and blended image generator 138 (optionally with other parts of TSCS 110) function collectively to update display screen 140 without requiring intervention by host processor 160.

In various embodiments, the same circuitry utilized by display screen updater 136 is utilized by blended image generator 138. Conversely, in some embodiments, display screen updater 136 has dedicated circuitry used only by display screen updater 136. Similarly, blended image generator 138 has dedicated circuitry which is only used by blended image generator 138.

Description of Components in Operation

FIG. 3 depicts a method for operating electronic device 100 and TSCS 110 to display images on display screen 140, in accordance with an embodiment of the present invention. The method shown in FIG. 3 will be described in conjunction with FIGS. 4A-6B. In one embodiment, method 300 is carried out by processors and electrical components under the control of computer-readable and computer-executable code. The computer-readable and computer-executable code reside, for example, in a data storage medium such as computer-usable volatile and non-volatile memory. However, the computer-readable and computer-executable code may reside in any type of computer-readable storage medium. In some embodiments, method 300 is performed at least by the system(s) described in FIGS. 1, 2 and 4A-6B. In particular, FIGS. 4A-6B depict various embodiments of displaying images on display screen 140.

At 310 of method 300, display screen 140 is updated with ones of images processed by and received from host processing system 160, wherein host processing system 160 is configured for primary processing of images for display on display screen 140. For example, in one embodiment, in reference to FIG. 4A, display screen 140 is updated with images processed by and received from host processing system 160. Images processed by and received from host processing system 160 can comprise video frames, pictures, web pages, maps, textual and non-textual documents, etc.

At 320 of method 300, a primary image received from host processing system 160 of FIG. 1 is held in first memory 131 of FIG. 2. First memory 131 is configured to hold a primary image for display on display screen 140. In an embodiment, first memory 131 is further configured to hold a plurality of primary images. In one embodiment, the primary image(s) are pre-loaded.

For example, referring to FIGS. 1 and 2, images from a video stream for display on display screen 140 can be first processed by host processing system 160 and subsequently held in first memory 131 as a series of primary images. That is, the first memory may hold different ones of a set of images as the primary image at different points in time, and these different images may form parts of a video viewable by users. In another example, the primary image is adjusted to produce a dynamic display viewable by users.

As another example, the primary image may be a static image, such as a user interface, a background, an application default page such as a text entry image, and the like. As further examples, primary images can also include single frames of image information (e.g., a frame from a document or a web page), menu pages (such as top level menu pages) for applications that employ a graphical user interface, and the like.

At 330 of method 300, a secondary image is held in second memory 132 of FIG. 2. In one embodiment, a plurality of images is held in second memory 132, one of which is the secondary image. In some embodiments, the secondary image (optionally with other image(s) held in second memory 132) is pre-loaded.

In some embodiments, a tertiary image or a plurality of tertiary images is held simultaneously with the secondary image in second memory 132. In some embodiments, second memory 132 is configured to hold a secondary image; a tertiary image, a plurality of tertiary images or a combination thereof.

A secondary image (or any other image held in the second memory, such as a tertiary image) may be a image of a plurality of different images. For example, the secondary image may comprise a pop-up window for display over a primary image. As other examples, the secondary image (or other image held in the second memory) may be a control (e.g., one or more pointers, buttons, media controls, etc.), a status indicator (e.g., for providing battery information, help information, etc), a passive image (e.g., a logo), an image associated with a type of user input (e.g. hovering, touching, tapping, pressing, swiping, stroking, handwriting, drawing, other gesturing, etc.), and the like.

In accordance to some embodiments of the present invention, the secondary image is smaller than the primary image. For example, in various embodiments, the secondary image is smaller than the primary image in physical size, bit size, or the like.

In some of the embodiments where the secondary image is typically smaller than the primary image, the second memory is smaller in capacity than the first memory.

The memory size required to hold an image increases with the image's color-depth and size (measured in pixels). The memory required to hold an image (such as the secondary image or any other images held in second memory 132) for blending may be reduced by utilizing a lower color-depth for those images.

In one embodiment, the secondary image is provided by host processing system 160. In some embodiments, the secondary image is provided by TSCS 110. The secondary image may be modified by host processing system 160, TSCS 110, or both. The provision or the adaptation of the secondary image may be in response to user input (e.g., user input detected using touch sensor 150).

In one embodiment, the secondary image changes. As some examples, a change may affect the secondary image's size, shape, color, transparency, etc. For example, the secondary image may be modified, or replaced entirely by host processing system 160 or TSCS 110. As will be described in detail below in connection with FIG. 5A-B, a secondary image changes in some embodiments to highlight controls that a user may interact with or to indicate key actuation. Also as will be described in detail below in connection with FIG. 6A-B, a secondary image (e.g., secondary image 620A of FIG. 6A) changes in some embodiments due to an inking function in response to user input. Moreover, in various embodiments, TSCS 110 configured to perform image processing such as, but not limited to, decompression, windowing or contrast enhancement.

At 340 of method 300, in response to sensing user input in a sensing region overlapping an active area of display screen 140: (1) a blended image comprising the primary image and the secondary image is autonomously generated; and (2) display screen 140 is autonomously updated with the blended image.

Performing method 300, as described above, embodiments of the present invention can provide low-latency visual feedback to the user that improves user experience with electronic device 100. The low-latency visual feedback to the user is provided, in part, by TSCS 110 autonomously generating a blended image for display on display screen 140 and autonomously updating display screen 140 with the blended image. Additionally, power consumption by electronic device 100 is reduced and/or performance requirements of various components of the electronic device 100 are relaxed.

In various embodiments in accordance with the present invention, blending technology is utilized to generate a blended image. For example, embodiments may use alpha blending technology. Alpha blending is one process for combining one or more overlay image(s) with a main image, and is useful for blending image elements from separate sources to create a single composite image. The overlay and main images may differ in size, resolution, color-depth, aspect ratio, and the like.

In some embodiments, the transparency or blend factor of the overlay image may be controlled as a percentage that defines the merging of the main image and the overlay image in any overlap regions of the two images. Outside the overlap region, the main image is displayed without any modification. The blending function may be accomplished according to the following relationship:

$$\text{Composite Image} = \text{Overlay Image}(\alpha) + \text{Main Image}(1-\alpha) \qquad \text{(Eq. 1)}$$

In many cases, the main image and the overlay image are rectangular in shape. In such embodiments, it is still possible to overlay a non-rectangular shaped image using chroma-key technology. Chroma-key allows the system to identify a particular color in the overlay image to be "transparent". When pixels in the overlay image contain the chroma-key value, the parts of the main image overlapped by these pixels are displayed unaltered. Thus, various embodiments may hold a secondary image as an overlay image, hold a main image as a primary image, and use alpha blending to overlay the secondary image onto the primary image.

Embodiments utilizing alpha blending or other blending technology may draw from a variety of blending options. For example, TSCS 110 may blend the same secondary image at different locations to generate multiple, different blended images. The different locations may be with respect to the primary image, the active area of display screen 140, or both. This may be done over time, such as to produce a set of blended images that move the secondary image when shown in sequence. As another example, TSCS 110 may blend multiple instances of the secondary image at different locations into one blended image. As yet another example, TSCS 110 may blend multiple instances of the secondary image at different locations into multiple blended images, such as to produce a set of blended images that effectively move the instances of the secondary image.

Embodiments may blend one or more other images in addition to the secondary image. For example, some embodiments may also blend a tertiary image or instances with the tertiary image to form a blended image.

In some embodiments, the location at which the secondary (or tertiary or other) image is blended is based on the user input. For example, in response to user input comprising an input object, a secondary image may be blended at a location based on the position of the input object. Specifically, the location may be selected to place the secondary image such that it is overlapped by the input object or offset from the input object. The offset may be static or dynamically determined based on user input factors such as speed, force, duration, and the like. As another example, in response to user input provided by multiple input objects, multiple instances of the secondary image (or the secondary image, a tertiary image, and optionally other images) may be blended at locations based on the positions of the input objects.

In some embodiments, the image selected as the secondary (or tertiary or other) image and blended is based on the user input. For example, a particular image may be associated with a type of user input sequence, and that particular image may be the secondary image blended in response to that type of user input sequence. As another example, a particular image may be associated with a type of input object, and that particular image may be the secondary image in response to user input comprising that type of input object.

Some embodiments accomplish blending by regularly or continuously updating coordinates that specify the location(s) where instance(s) of the secondary image is blended. This approach allows TSCS 110 to generate different blended images while allowing the secondary image to remain unchanged in second memory 132.

Embodiments may also change the blend factor over space, over time, or both. For example, some embodiments may increase or decrease the blend factor to fade in or fade out an image. As another example, some embodiments may define different blend factors for different regions of a primary image or display screen active area. When a secondary image is blended in those regions, the associated blend factors are used.

In some embodiments, this autonomous blending and updating occurs near or at the display refresh rate; these embodiments thus support an image update rate (and thus the perceived rate of motion) near to the display refresh rate.

Described below are specific examples of operation of the present invention. The specific examples refer to FIGS. 4A-6B, which depict visual feedback in response to user input, in accordance to embodiments of the present invention. FIGS. 4A-6B. In particular, in various examples, operation of the present invention includes TSCS 110 autonomously generating a blended image and autonomously updating display screen 140 with the blended image.

Figure 4A:
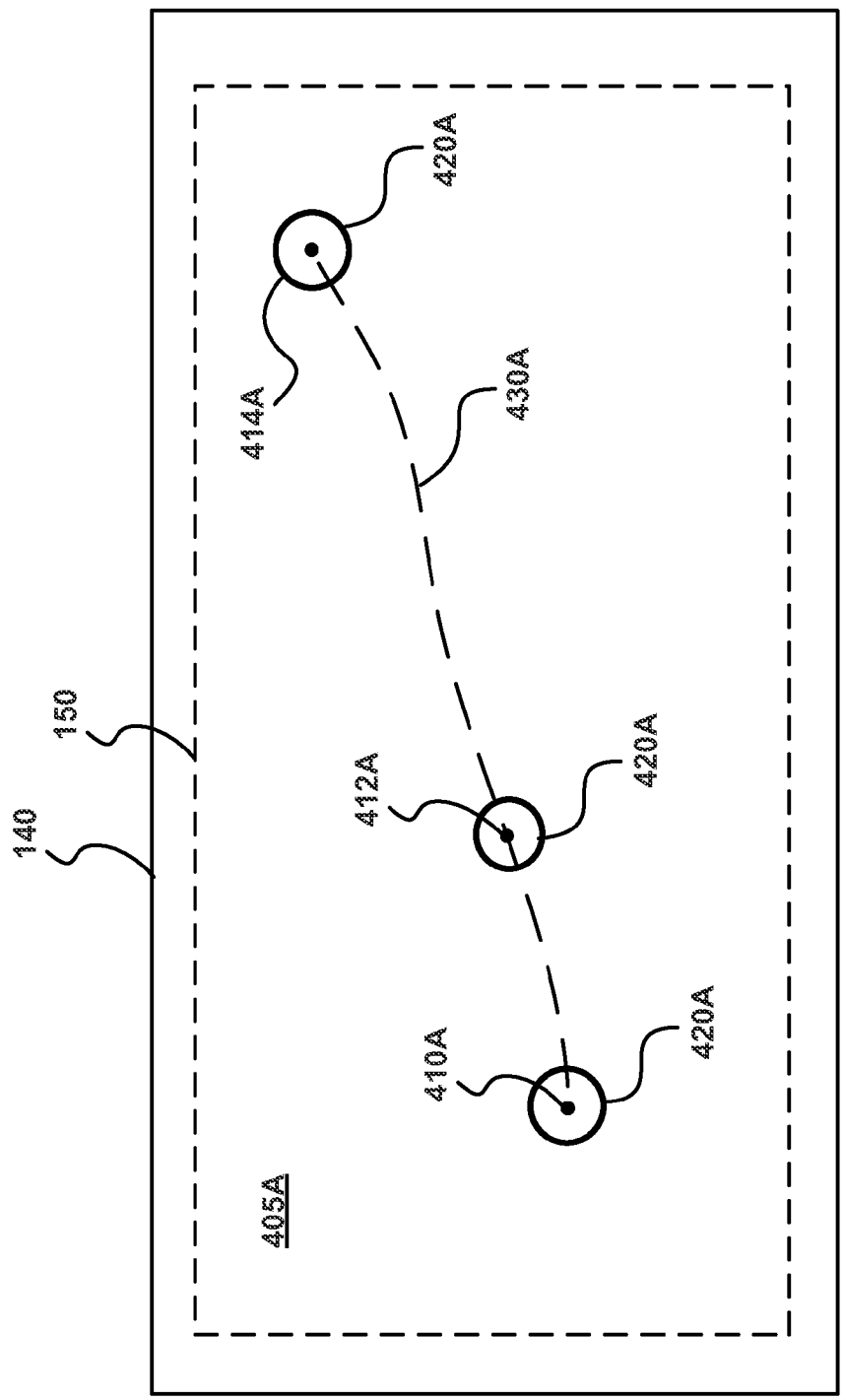
FIGS. 4A-6B illustrates examples of visual feedback provided in response to user input, in accordance with embodiments of the present invention.

Referring now to FIG. 4A, a drag operation is depicted, in accordance to an embodiment of the present invention. In general, in response to user input, secondary image 420A is continually updated to appear as dragged along (at or offset from) user input path 430A from location 410A to location 414A.

In particular, a user input (e.g., comprising one or more user fingers initiating a drag operation) is provided. The user input starts at location 410A in a sensing region of touch sensor 150, which overlaps an active area of display screen 140. In response to the user input, a blended image comprising primary image 405A (e.g., a background image) and secondary image 420A (e.g., a circular icon) is autonomously generated by TSCS 110. Furthermore, display screen 140 is autonomously updated by TSCS 110 with the blended image. The blended image locates secondary image 420 at (or offset from) location 410A.

As user input path 430A is created by the user input, multiple blended images are autonomously generated by TSCS 110. These blended images depict secondary image 420A at different locations along user input path 430A. Display screen 140 is autonomously updated by TSCS 110 with the blended images. For example, when the one or more input objects providing the user input are positioned at location 412A along user input path 430A, a blended image is autonomously generated by TSCS 110. This blended image locates secondary image 420A in a position determined by the user input at location 412A, and in front of the primary image 405A. Display screen 140 is autonomously updated with this blended image by TSCS 110.

Similarly, when the one or more input objects providing the user input is located at location 414A, a blended image is autonomously generated by TSCS 110 in response to the user input, and display screen 140 is autonomously updated with the blended image. This blended image locates secondary image 420A in a position determined by the user input at location 414A. In response to movement of the user input, TSCS 110 repeatedly updates the location at which secondary image 420A is blended, with respect to the primary image 405A (or with respect to another appropriate reference, such as the active area of display screen 140). TSCS 110 also repeatedly updates display screen 140 with the blended images. This moves secondary image 420A with respect to primary image 405A, display screen 140, or both.

In some embodiments, the resulting latency between user input and corresponding visual feedback is a function of the time to process the user input, the time to determine the updated blending, and the time to update display screen 140 with the blended image. In some embodiments, the blended image is generated on the fly, and the combined image is written directly to display screen 140. In such embodiments, the time to determine the updated blending may substantively comprise only the time needed to determine coordinates at which the secondary (and/or other images) are blended with the primary image.

FIG. 4A depicts the same secondary image and the same primary image at different parts of the drag function. Other embodiments may blend different images at different points in time, space, or user input function sequence. For example, an image indicative of drag initiation may be used as secondary image at location 410A, an image indicative of drag continuation may be used as the secondary image at location 412A, or an image indicative of drag termination may be used as the secondary image at location 414A.

In some embodiments, in response to a termination of the drag operation, host processing system 160 updates the primary image held in first memory 131 to include the item that was dragged at a new location determined by the drag operation. For example, after the drag operation shown in FIG. 4A terminates at location 414A, some embodiments update primary image 405A to include an image of the item dragged (the circular icon that was secondary image 420A) at location 414A. In some embodiments, host processing system 160 performs this updating of the primary image.

With such an approach, primary image 405A is not corrupted or changed in first memory 131 while the blended images depict secondary image 420A being dragged in response to user input.

The secondary image 420A shown is the item that the user is dragging. However, in some embodiments, different images are considered the secondary image and blended for different operations. For example, a blue star may be provided when a drag operation occurs. In contrast, two stacked fingers may be provided in response to another operation, such as a double-tap operation.

Still referring to FIG. 4A, in another example, touch sensor 150 is used to track user input (e.g., a finger hovering over or touching display screen 140 and moving across display screen 140). TSCS 110 can then perform blending autonomously to provide visual feedback in the form of a cursor or historical tracing of the user's finger without requiring intervention by the associated host processing system 160. In some embodiments, host processing system 160 intervenes when the user interacts with an icon or other interactive element shown on display screen 140.

Referring to FIGS. 1 and 2, the discussion will continue with the detailed description of the operation of the structure and components in accordance to various embodiments of the present invention. In particular, the operation of TSCS 110, TSCC 120 and DCC 130.

Embodiments of TSCS 110 may include computational capability that enables it to discriminate or ascertain proper responses to user input. For example, TSCS 110 may make decisions, formulate responses, or cause actions by itself. Also, TSCS 110 may respond to user input that are relevant to one or more electronic applications, without requiring constant or periodic communications with host processing system 160. Example responses include adjustments to an image being displayed.

In various embodiments, TSCC 120 and DCC 130 are integrated or otherwise in direct communication, such that the duties of host processing system 160 associated with performing some touch or display tasks are reduced. The communication between TSCC 120, host processing system 160, and DCC 130 may be accomplished by TSCC 120 sending information such as touch coordinates or gesture commands to DCC 130, before or in parallel with sending them to host processing system 160.

In various embodiments, TSCS 110 comprises logic circuitry. The logic circuitry is configured to control the flow of information between one or more of: (1) TSCC 120 and DCC 130, (2) DCC 130 and host processing system 160, and (3) TSCC 120 and host processing system 160. The logic circuitry can control a communication link between TSCS 110 and host processing system 160. In some embodiments, the logic circuitry controls communication links between DCC 130 and host processing system 160, between TSCC 120 and host processing system 160, or both.

In some embodiments, the logic circuitry controls the flow of communication between host processing system 160 and TSCC 110, and provides discriminatory or interpretive capabilities in the communications. With this configuration, the logic circuitry can reduce the frequency of interactions with host processing system 160.

The logic circuitry may comprise circuitry specifically for implementing the computational logic, general use processor circuitry programmed to perform the functions of the computational logic, or a combination thereof. For example, in some embodiments, the logic circuitry is hard wired with rules. As another example, in some embodiments, the logic circuitry comprises computational circuitry coupled with appropriate rules held in memory. The rules may comprise computer-executable code, data associating actions with conditions stored in tables or other structures, etc.

The logic implemented can be application specific. In some embodiments, this is enabled by employing different logic circuits in conjunction with different applications. In some embodiments, this is enabled by employing different rule sets held simultaneously in memory. In some further embodiments, this is enabled by rewriting rule sets held in memory.

With reference now to FIG. 2, display refresh circuitry 134 includes blended image generator 138 and display screen updater 136. Blended image generator 138 autonomously generates the blended images by blending a primary image held in first memory 131 and a secondary image held in the secondary memory 132 (optionally with other images held in TSCS 110 and/or with one or more copies of the secondary image). For example, for the response shown in FIG. 4A-C, the blended image comprises primary image 405A and secondary image 420A. Display screen updater 136 autonomously updates display screen 140 with the blended images generated by blended image generator 138.

Blended images may also be used to provide pop-ups that enhance user experience. For example, during audio, picture, or video playback, media controls (such as play, pause, fast forward, rewind, volume, back, forward, etc) can pop-up over the imagery displayed. In reference to FIG. 1, this pop-up response may be provided by TSCS 110 in response to TSCS 110 detecting contact (e.g., taps, touches of particular durations) or non-contact (e.g., stationary or dynamic hover) user input near display screen 140, without involvement of host processing system 160. Thus, some embodiments respond to select non-contact user input with pop-up menus or controls. Such "floating" or "hover-based" tracking feedback in response to user input that is not touching the touch sensor 150 may also be implemented using a blending scheme.

In some embodiments, host processing system 160 may become involved when the user interacts with one of the controls shown in the blended image that affects the media displayed. This pop-up functionality may be used for other controls, such as to drawing controls when a drawing program is active, to editing commands when a document editor is active, and the like.

In various embodiments, the blended image may also be used to provide visual feedback through various icons or other similar images produced responsive to the user input. For example, if a gesture is performed which involves rotating an image, a "rotate" icon can be used as the secondary image and displayed with the primary image without the host processing system's intervention. Meanwhile, host processing system 160 may perform the image processing needed to rotate the image provide updated primary images as needed to perform the rotation.

Figure 4B:
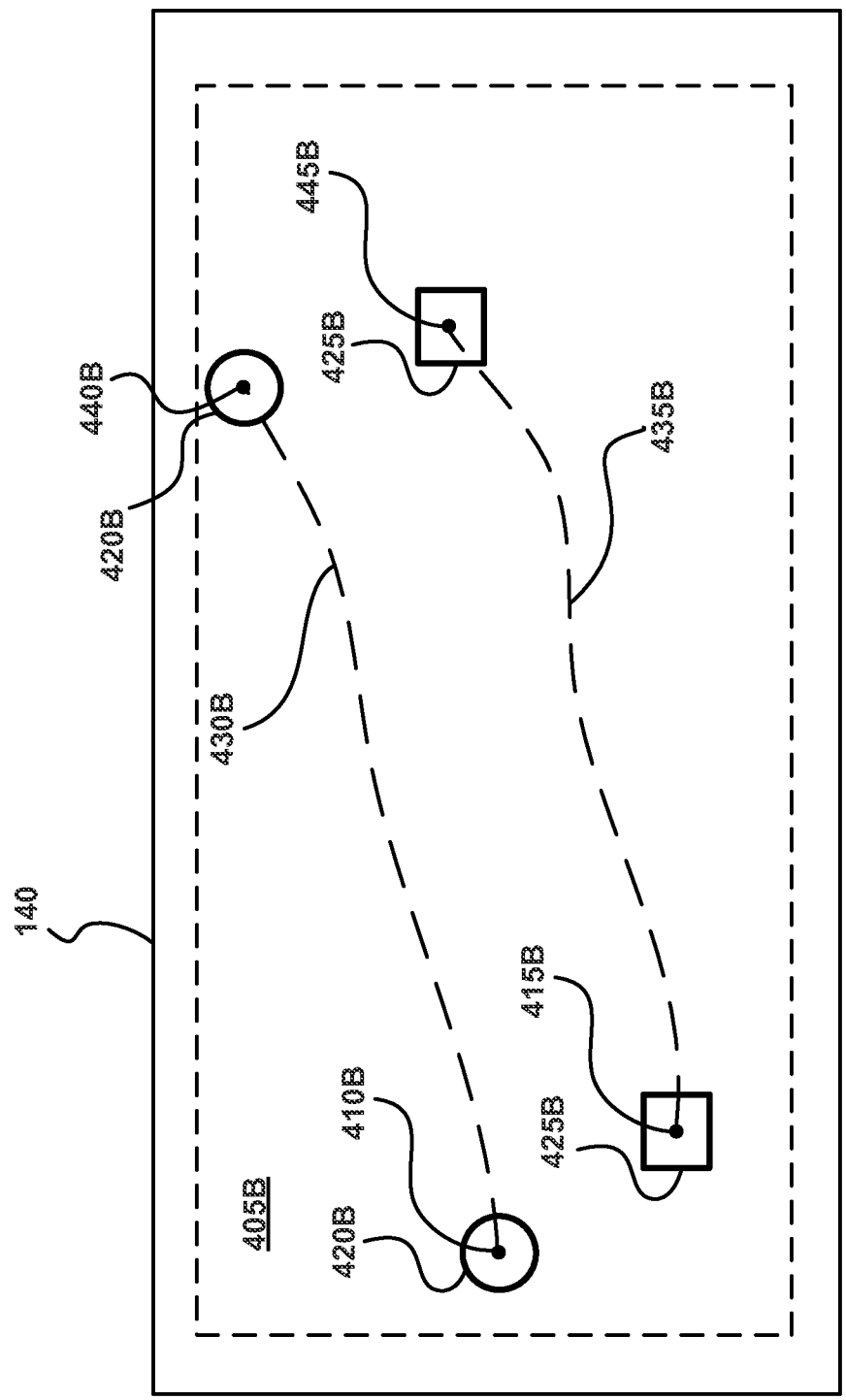

In one embodiment, referring to FIG. 4B, method 300 further comprises holding tertiary image 425B simultaneously with secondary image 420B in TSCS 110. The generated blended image comprises primary image 405B, secondary image 420B, and tertiary image 425B. In one embodiment, tertiary image 425B is held in second memory 132. In another embodiment, tertiary image 425B is held elsewhere in TSCS 110, such as in a third memory (not shown).

For example, still referring to FIG. 4B, a pan operation performed by two input objects (e.g. a two-finger pan operation) is depicted, in accordance to an embodiment of the present invention. In some embodiments, the primary image 405B shown in display screen 140 is a portion of a larger image (e.g., a map, a picture, a text document, a web page). The pan operation depicted in FIG. 4B changes what is shown by display screen 140 to show moving a "viewport" over the larger image. In some embodiments, host processing system 160 updates the primary image to provide the motion. In some other embodiments, the first memory holds the larger image, and TSCS 110 determines what portion of the larger image to display. For clarity, the changing image is not shown FIG. 4B As described above, some embodiments of TSCS 110 may implement viewports autonomously. In some implementations of viewports, the first memory is configured to hold more image data than can be displayed at one time by being physically larger, via compression of image data, or a combination thereof. The compression technology could be highly efficient (e.g., Run-length encoding (RLE)-based compression) or could be lossy (e.g., individual pixel replacement). In some embodiments, during operation, the "viewport" may be the same size or smaller than the physical size of the active area of display screen 140. The "viewport" can be virtually moved over the image, such as in response to user input in the sensing region, and define what image data is displayed on display screen 140.

As shown in FIG. 4B, to indicate the panning function, secondary image 420B and tertiary image 425B are blended with primary image 405B at locations associated with first and second input objects. As shown, secondary image 420B is associated with a first input object following user input path 430B and tertiary image 425B are associated with a second input object following user input path 435B. Accordingly, the autonomously generated blended image comprises primary image 405B, secondary image 420B and tertiary image 425B. As the input objects move, TSCS 110 repeatedly generates blended images with secondary image 420B and tertiary image 425B at locations associated with positions of the input objects, and repeatedly updates display screen 140 with the blended images. Thus, secondary image 420B and tertiary image 425B move in such a way that they follow the input objects along user input paths 430B an 435B exactly or with an offset.

Figure 4C:
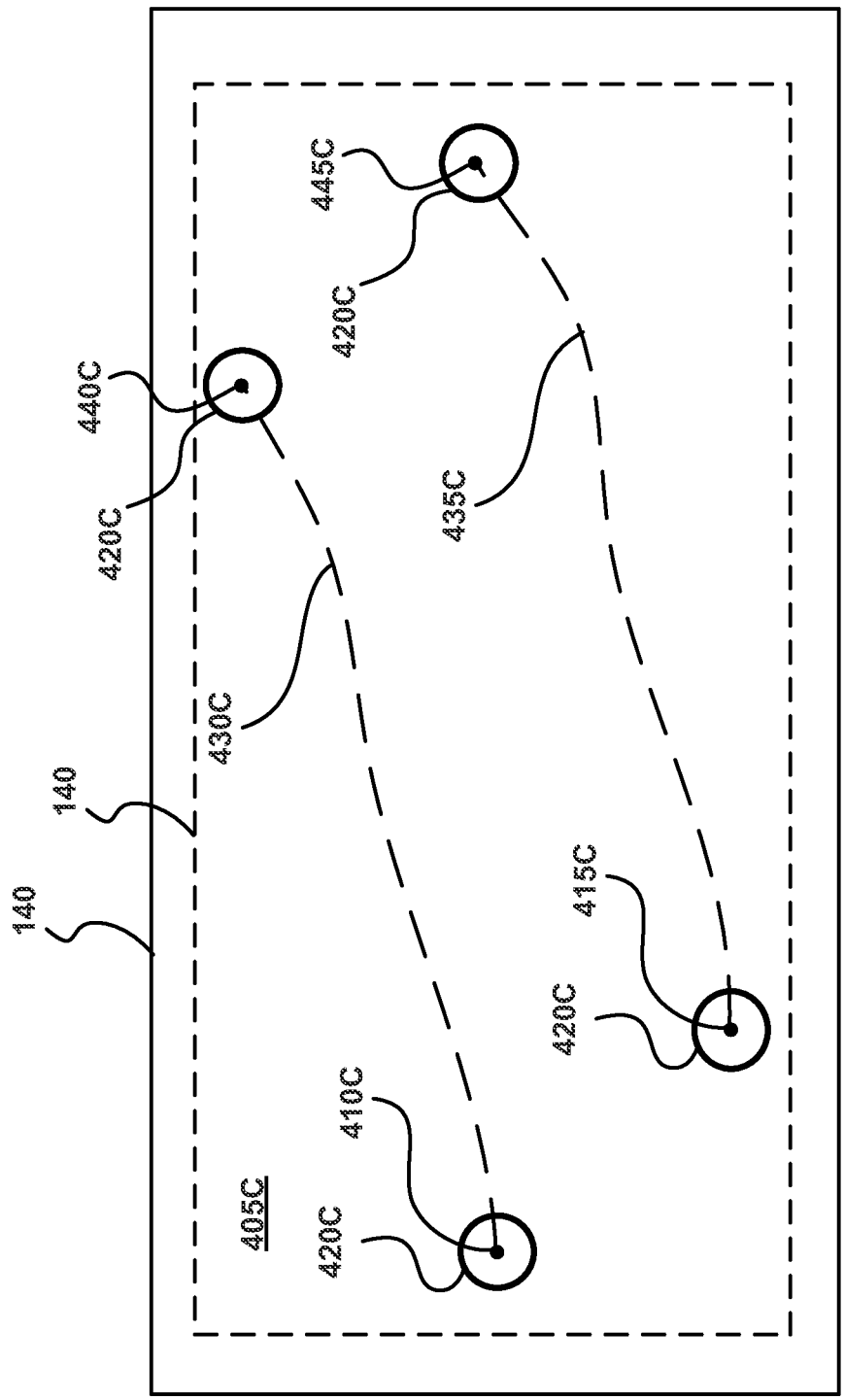

For example, referring to FIG. 4C, another two-input-object panning operation is depicted, in accordance to an embodiment of the present invention. The operation depicted in FIG. 4C is similar to the operation depicted in FIG. 4B, as described above. However, to indicate the function, a secondary image is blended at two different locations with respect to the primary image. For convenience, they are referred to here as secondary image 420C and copy of secondary image 425C. Secondary image 420C is associated with a first input object following user input path 430C. Similarly, copy of secondary image 425C is associated with a second input object following user input path 435C. Accordingly, the autonomously generated blended image comprises primary image 405C, secondary image 420C and copy of secondary image 425C. As the input objects move, TSCS 110 repeatedly generates blended images with secondary image 420C and copy of secondary image 425C at different locations with respect to display screen 140 (or another appropriate reference, such as with respect to primary image 405C), and repeatedly updates display screen 140 with the blended images. Thus, secondary image 420C and copy of secondary image 425C appear to move with respect to the primary image 405C and/or display screen 140, and follow the input objects along user input paths 430C and 435C, respectively.

In a further embodiment of method 300, in accordance to an embodiment of the present invention, a beginning of a sequence of user input operations is determined. Additional blended images are generated in response to the sequence of user input operations. Display screen 140 of FIG. 4C is updated with the additional blended images without intervention by host processing system 160 of FIG. 1, in response to the sequence of user input operations. An ending of the sequence of user input operations is determined. An indication is provided to host processing system 160 of the sequence of user input operations.

In various embodiments, the indication provided to host processing system 160 may comprise a signal purely indicating the termination of the sequence of user input operations. In some embodiments, the indication provided to host processing system 160 about user input can comprise information about the user input (e.g., gestures recognized, characters inputted, overall motion of input objects comprising the user input, functions selected text entered, the number of input objects, the types of input objects, positional information, force information, and the like. The indication may cause host processing system 160 to switch from a low power state to a full power state, launch or close an application, etc.

For example, referring to FIG. 4C, in one embodiment, user input indicative of a beginning of a sequence of user input operations is provided by input objects at locations 410C and 415C. In response to determining the beginning the sequence of user input operations, TSCS 110 generates a blended image comprising primary image 405C and secondary image 420C. The blended image is used to update display screen 140.

In the sequence of user input operations, a first input object moves along user input path 430C to location 140 and a second input objects moves along user input path 435C to location 445C. In response to the sequence of user input operations involving movement of input objects along the user input paths 430C and 435C, additional blended images are generated. The additional blended images blend secondary image 420C and copy of secondary image 425C at different locations associated with the input objects along user input paths 430C and 435C. The TSCS 110 uses the additional blended images to update display screen 140. The TSCS 110 accomplishes these actions without intervention by host processing system 160.

FIGS. 4A-4C show a few examples of blending of secondary images with primary images that provide visual feedback to user input. Many variations exist and are contemplated. For example, secondary images may comprise any number of shapes, colors, and sizes. As another example, any number of images and copies of images may be blended, such as at different times, in different orientations, or in different locations.

As a specific example, a secondary image may comprise an angle shape. In response to a "pinch" or "spread" user input with input objects moving together or moving apart, respectively, the angle shape may be oriented and located to follow the input object motion. In some embodiments, this can emulate two or more corners of a picture frame, and the expanding or contracting of that picture "frame".

In some embodiments, the secondary image is blended to highlight portion(s) of the primary image. In some embodiments, the secondary image is blended at locations corresponding to position of user input.

An end to the sequence of user input operations is determined, for example, when the user input comprises one or more input objects lifting away from a surface of the touch sensor or exiting the sensing region. Some embodiments determine the end by determining that user input is no longer sensed in the sensing region of touch sensor 150. In some embodiments, TSCS 110 provides an indication of the sequence of user input operations to host processing system 160 in response to the termination of the sequence of user input operations.

In various embodiments of method 300, an independent blending function is initiated in response to a first signal and the independent blending function is terminated in response to a second signal. During the independent blending function, TSCS 110 autonomously generates blended images and updates display screen 140 with the blended images without intervention by host processing system 160. For example, the independent blending function is an alpha blending function, as described in detail above.

In some embodiments, and in reference to FIG. 1, host processing system 160 determines that a response to a user input does not require intervention by host processing system 160. Accordingly, host processing system 160 provides the first signal to initiate the independent blending function.

In some embodiments, host processing system 160 also provides the second signal to terminate the independent blending function. In some embodiments, TSCS 110 terminates the independent blending function and provides an indication of the termination of the independent blending function to host processing system 160.

Also in reference to FIG. 1, in some embodiments, TSCS 110 determines that a response to a user input does not require intervention by host processing system 160. Accordingly, in various embodiments, TSCS 110 autonomously initiates the blending function. In some embodiments, TSCS 110 then provides an indication to host processing system 160 that the independent blending function has begun. In some embodiments, TSCS 110 autonomously performs the independent blending function, and indicates to host processing system 160 that the independent blending function occurred after a termination of the function.

Figure 5A:
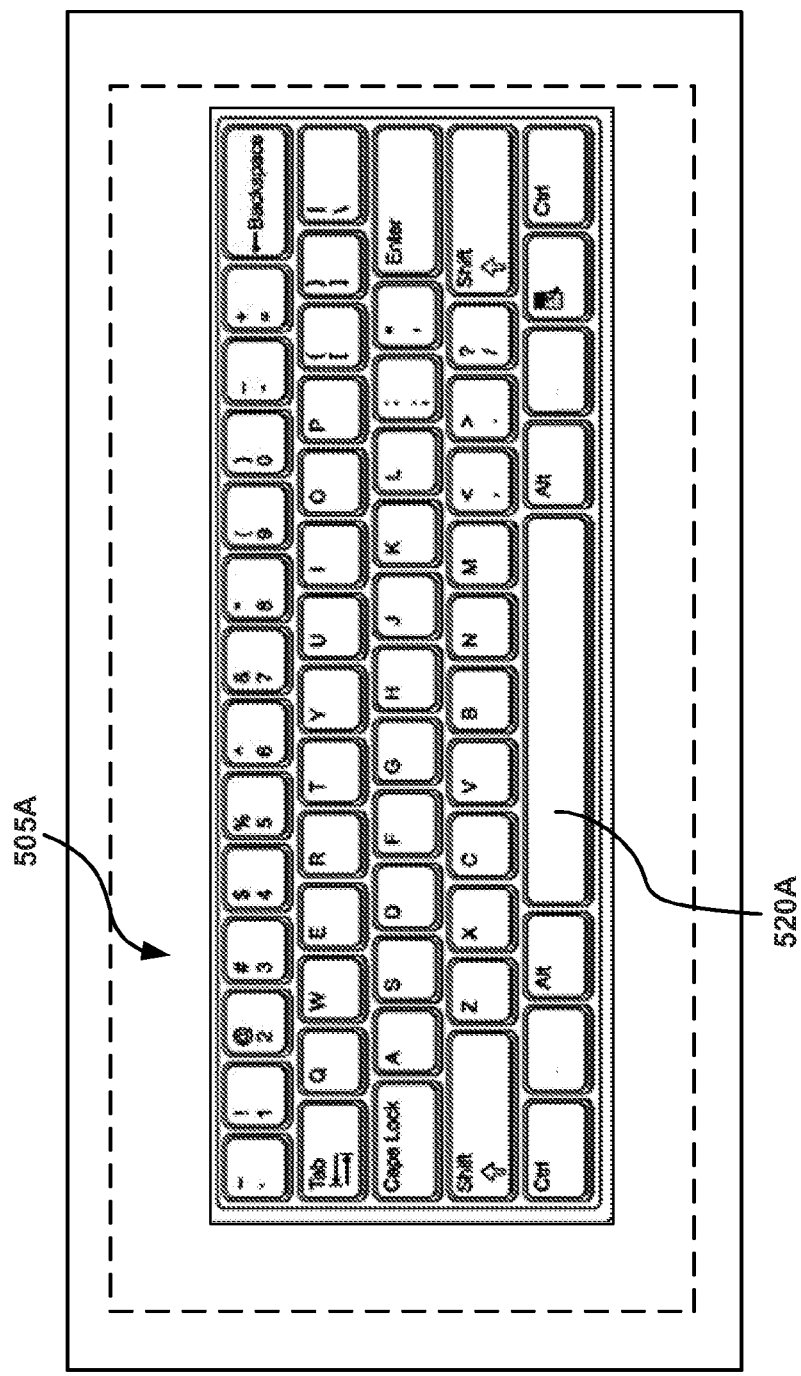
Figure 5B:
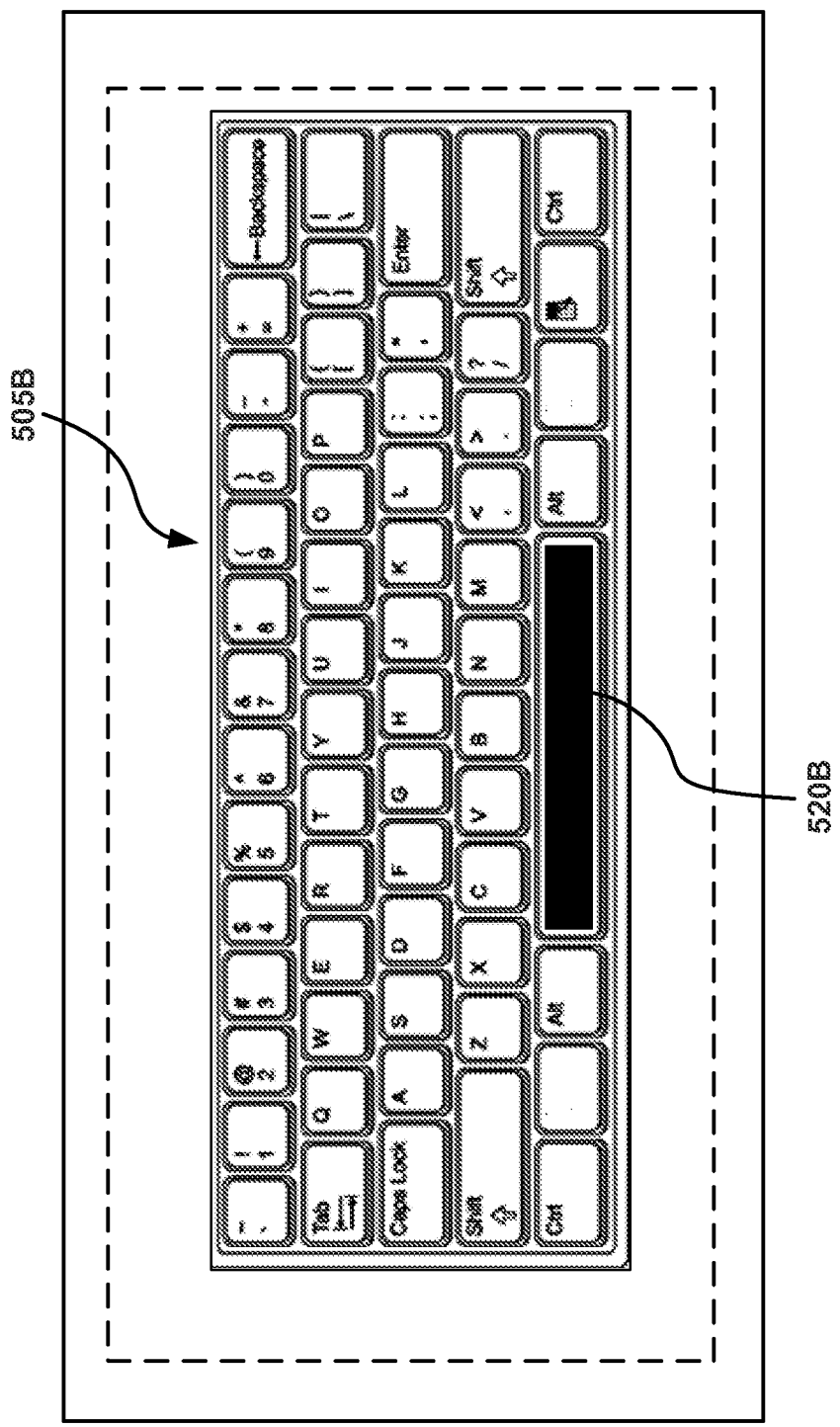

In a further embodiment of method 300, in reference to FIGS. 5A-B, primary image 505A comprises an image of a virtual keyboard. Second memory 132 contains a plurality of key images (e.g., an actuated image of the space bar, such as key image 520A) associated with the virtual keyboard. User actuation of a key (e.g., space bar) of the virtual keyboard based on the user input is determined. A key image of the plurality of key images is selected as the secondary image to be blended with the primary image, such that the blended image shows the virtual keyboard with actuation of the selected key. For example, in response to user input for actuation of key image 520A, a secondary image 520B of FIG. 5B of an actuated space bar is selected to show the space bar actuated on the virtual keyboard. In some embodiments the plurality of key images held in second memory 132 is a subset (and not the full set) of the actuable keys. In response to actuation of a key not associated with a key image held in second memory 132, host processing system 160 may provide image(s) of the actuated key(s) for blending by TSCS 110 or provide an image of the virtual keyboard with the appropriate key(s) shown as actuated.

In another embodiment of method 300, TSCS 110 blends multiple images held in second memory 132 with the primary image. For example, the primary image may comprise an image of a virtual keyboard, and second memory 132 may hold a generic key image along with a plurality of additional images associated with specific keys (e.g. images of characters or word radicals). In response to user input actuating a key of the virtual keyboard (e.g., "#"), TSCS 110 blends the appropriate image associated the "#" key, the generic key image, and the primary image, such that the blended image shows the virtual keyboard with actuation of the selected key.

In another embodiment of method 300, TSCS 110 modifies the secondary image before blending with the primary image. Example modifications include size, shape, color, transparency, etc. For example, the primary image may comprise an image of a virtual keyboard and the secondary image may comprise a generic key image. In response to user input actuating a key of the virtual keyboard (e.g., "W"), TSCS 110 modifies the secondary image to place a "W" in an appropriate part of the secondary image, such that the blended image shows the virtual keyboard with actuation of the selected key.

Indicators other than images of actuated keys may be used to provide visual feedback from key actuation. For example, referring to FIGS. 5A-B, a highlighter comprising a colored rectangle may be the secondary image 520B blended with the primary image 520A to provide visual feedback of actuation. In some embodiments, second memory 132 holds a single highlighter, and use the same highlighter (modified or not modified by TSCS 110) for multiple keys. In some embodiments, second memory 132 holds multiple highlighters of different sizes and shapes, and TSCS 110 blends an appropriate highlighter (modified or not modified by TSCS 110) for the actuated key(s).

Highlighting of keys may be used to indicate which key(s) would be actuated if a selection input was provided, instead or in addition to indicating key actuation (s). For example, non-contact user input that hovers over an area associated with the "Q" key for more than a reference amount of time may cause the "Q" key to highlight. Contact user input may then cause actuation of the "Q" key and entry of "Q" into a memory buffer.

Figure 6A:
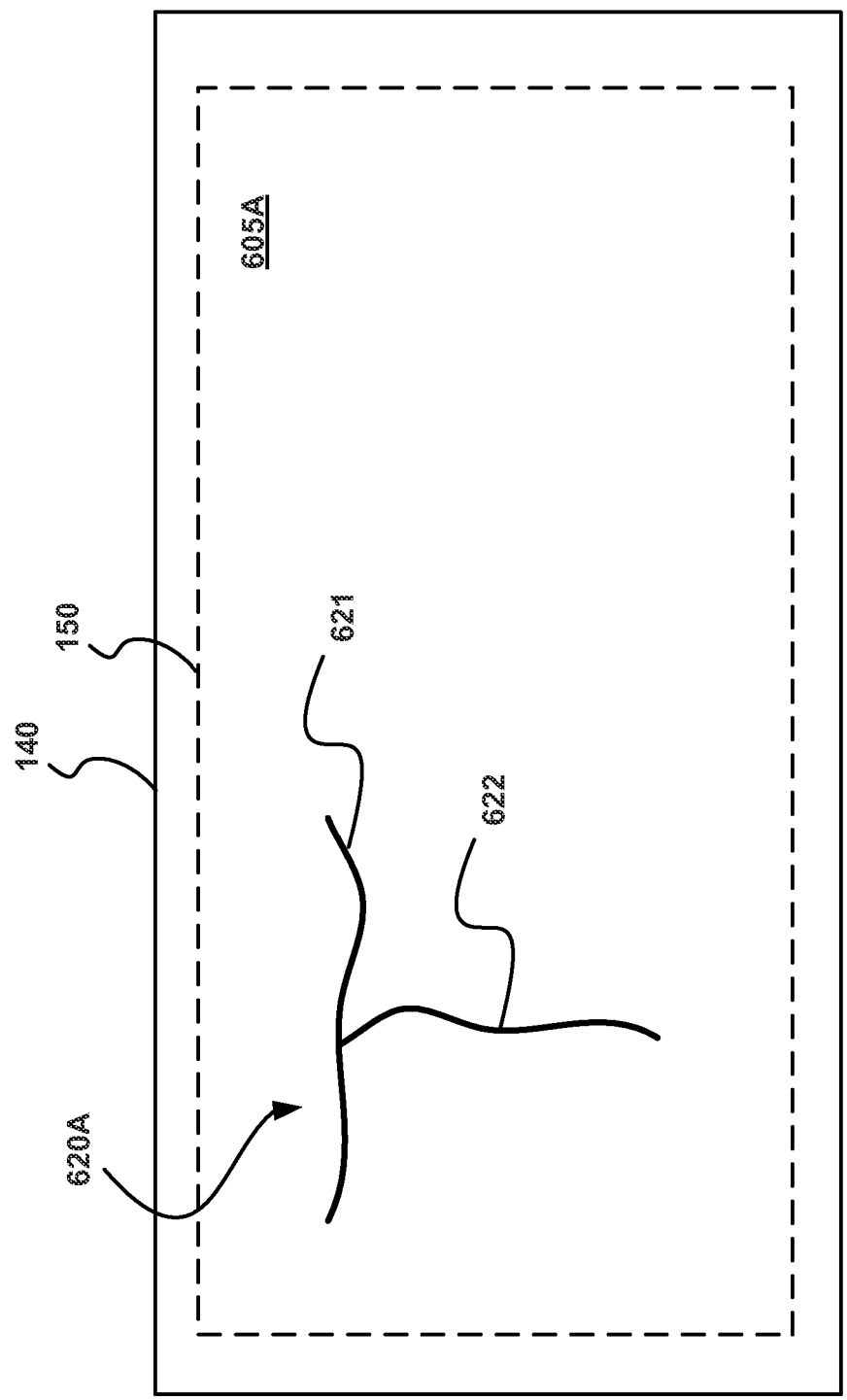
Figure 6B:
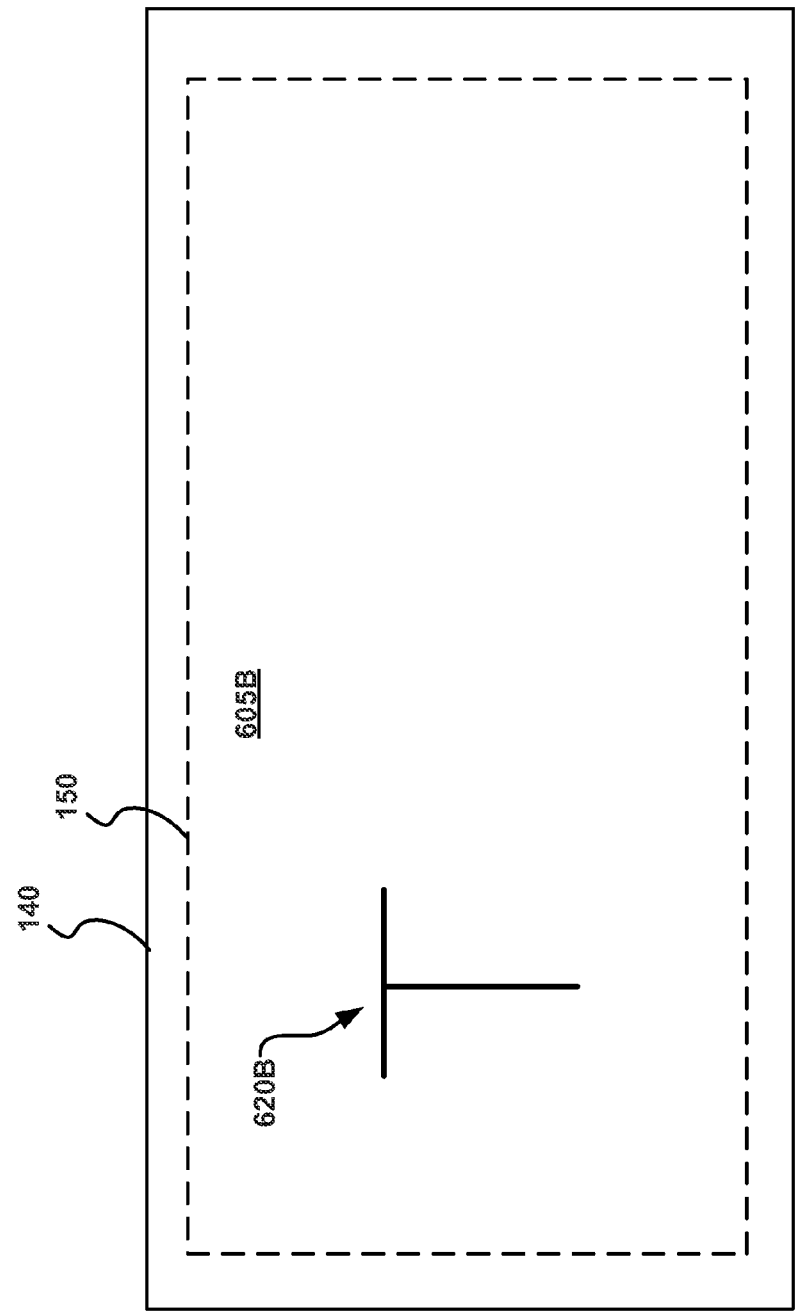

In one embodiment of method 300, in reference to FIGS. 6A-B, secondary image 620A is modified in response to the user input, without intervention by host processing system 160 of FIG. 1. In particular, secondary image 620A comprises inking associated with movement of the user input.

For example, a user input of a handwritten letter "T" is provided. As the handwritten letter "T" is created by the user input along user input paths 621 and 622, TSCS 110 modifies the secondary image to match. Thus, the blended images that are autonomously generated and used to update display screen 140 inks along the handwritten letter "T". That is, the repeated blending of primary image 605A and the adapted secondary image 620A shows inking. Furthermore, in some embodiments, when the user's input of the handwritten letter "T" is recognized as the letter "T," the handwritten letter "T" is replaced a typed letter "T" on display screen 140.

In various embodiments, host processing system 160 of FIG. 1 downloads character recognition code into TSCS 110. TSCS 110 implements most or the entire character recognition functionality. This can include low-latency stroke drawing, haptic feedback, and dictionary correction, and the like. A standard handwriting or keypad input interface can be used for communicating with host processing system 160. Host processing system 160 can configure character recognition functionality by downloading different code, for different languages, character sets, etc.

In some embodiments of method 300, TSCS 110 provides indication to host processing system 160 that triggers host processing system 160 to be in a low power state during at least part of the generating a blended image and updating display screen 140 with the blended image. In various embodiments, the indication comprises user input information, from which host processing system 160 determines that it may enter a low power state. In some embodiments, the indication comprises a signal specifically to indicate to host processing system 160 that it may enter a low power state.

For example, a drag operation, as depicted in FIG. 4A, is performed. Host processing system 160 if FIG. 1 is triggered to be in a low power state once it is determined that the drag operation has initiated. Accordingly, power consumption is reduced.

In some embodiments, host processing system 160 provides software to implement a complete nested menu GUI to TSCS 110. The user can navigate through the nested menu structure without any intervention from host processing system 160. TSCS 110 renders the menus and host processing system 160 can go into a lower power state. When the user makes a menu selection, the processing system 160 is awakened if necessary and the processing responsibility is transferred back to processing system 160 as appropriate.

In embodiments of method 300, primary, secondary and/or tertiary images are customized depending on an application running on host processing system 160. In some embodiments, a secondary image is provided based on an application running on host processing system 160 of FIG. 1. Similarly, in some embodiments, the primary image is provided based on an application running on host processing system 160. The application can be displayed, have focus or priority over other applications running on host processing system 160. In a further embodiment, a secondary image is based on an application correlated with user input.

For example, a word processing application and a web browser are both running on host processing system 160. The web browser has focus or priority over the word processing application when the user is actively using the web browser. Similarly, the word processing application has focus or priority over the web browser when the user is actively using the word processing system rather than the web browser. A secondary image, for example, a semi-transparent pop-up box comprising a list of word processing functions, is provided when the word processing application has priority on display screen 140. Accordingly, in response to sensing user input associated with the word processing application, a blended image comprising a primary image and the semi-transparent pup-up box is autonomously generated, and display screen 140 is autonomously updated with the blended image. The word processing and web browser are example applications, and any number and type of applications may run on host processing system 160.

Moreover, TSCS 110 of FIGS. 1 and 2 may provide an interpretation of the user input as part of its communication with the host processor. The interpretive function of TSCS 110 can be made reconfigurable or application specific. TSCS 110 may not need to report every instance of user input to host processing system 160, but rather only those instances of user input that are significant or relevant to the application being processed at a given time.

In various embodiments of the present invention, various devices other than display screen 140 provide feedback to the user. In one embodiment, a haptic actuator (not shown) is controlled via device control module 125 of FIG. 2 and provides haptic feedback to the user. As a result of the haptic feedback, a user's sense of comfort and confidence in electrical device 100 of FIG. 1 is enhanced. In one example, the haptic actuator provides tactile feedback such as a physical resistance or a non-linear mechanical response to user input. In another example, the haptic actuator provides a buzzing or a vibratory response to user input. Other devices may be utilized that provide aural feedback via clicks, pings, thuds, or other sounds.

Moreover, alternate or additional components, such as other interface or feedback devices may be utilized. These alternate or additional devices include microphones, speakers and other audio devices, force sensors, motion sensors, accelerometers, gyroscopes, optical detectors, imaging devices, mechanical buttons, latches, levers, sliders and the like.

In various embodiments of the present invention, electronic device 100 includes a security function without requiring intervention by host processing system 160. In one embodiment, electronic device 100 is unlocked, in response to sensing user input in a sensing region overlapping an active area of said display screen 140. TSCS 110 may not allow host processing system 160 to power up or allow electronic device 100 to accept other input until electronic device 100 is unlocked.

In some embodiments, in response to a failed attempt to unlock electronic device 100, a secondary image configured for responding to a failed attempt to unlock electronic device 100 is displayed on display screen 140.

In various embodiments, TSCS 110 holds secure passwords and encryption keys in a protected area of its memory that cannot be read out by host processing system 160. TSCS 110 displays an on-screen, virtual keypad that allows users to enter passwords. TSCS 110 then compares user input via the keypad to one or more passwords held in memory. If the password is correct, TSCS 110 releases an encryption key to host processing system 160.

Because host processing system 160 is not involved in the storage or entry of the password, malicious software running on host processing system 160 cannot snoop on the storage and/or entry of the password.

Various embodiments of the present invention are thus described. While the present invention has been described in particular embodiments, it should be appreciated that the present invention should not be construed as limited by such embodiments, but rather construed according to the following claims.

The invention claimed is:

1. An electronic device comprising:
 a display screen configured for displaying images;
 a touch sensor having a sensing region, wherein said sensing region overlaps with an active area of said display screen;
 a host processing system configured for:
  primary processing of said images for display on said display screen; and
  in response to an initiation of a drag operation, provide, as a secondary image, an image to be dragged in said drag operation, so that said blended image comprises a movement of said image to be dragged with respect to said primary image; and
  in response to a termination of said drag operation, update a primary image to include a copy of said image to be dragged at a location defined by said drag operation; and
 a touch screen control system comprising:
  touch sensor control circuitry configured to operate said touch sensor to detect user input in said sensing region, wherein responsive to said detection said touch sensor control circuitry is configured to provide an indication to said host processing system that causes said host processing system to enter a low power state; and
  display control circuitry configured to operate said display screen, said display circuitry comprising:
   a first memory configured to hold said primary image provided by said host processing system;
   a second memory configured to hold said secondary image; and
   display refresh circuitry configured to:
    update said display screen with ones of said images processed by said host processing system, and
    in response to said user input and without requiring intervention by said host processing system following said detection of said user input:
     generate a blended image comprising said primary image and said secondary image, and update said display screen with said blended image, such that said generating a blended image and updating said display screen with said blended image reduces processing by said host processing system by allowing said host processing system to remain in said low power state while said display refresh circuitry generates said blended image and updates said display screen with said blended image.

2. The device of claim 1, wherein said display refresh circuitry is configured to generate said blended image comprising said primary image and said secondary image by:
blending said secondary image at a location relative to said primary image, wherein said location relative to said primary image is based on at least one of a position and a motion of said user input.

3. The device of claim 1, wherein said host processing system is further configured to provide one of a plurality of images as said secondary image based on an application running on said host processing system.

4. The device of claim 1, wherein said host processing system is further configured to provide one of a plurality of images as said secondary image based on an application running on said host processing system having priority.

5. The device of claim 1, wherein said host processing system is further configured to update said primary image or said secondary image at a maximum image data update rate, wherein said display control circuitry is configured to generate and update at a maximum blended image update rate, and wherein said maximum image data update rate is lower than said maximum blended image update rate.

6. A touch screen control system configured to communicate with a host processing system, wherein said host processing system is configured for primary processing of images for display on a display screen, said touch screen control system comprising:
touch sensor control circuitry configured to control touch sensor elements for detecting user input in a sensing region of said touch sensor elements, wherein said sensing region overlaps with an active area of said display screen, wherein responsive to said detection said touch sensor control circuitry is configured to provide an indication to said host processing system that causes said host processing system to enter a low power state; and
display control circuitry configured to control said display screen, said display control circuitry comprising:
a first memory configured to hold a primary image provided by said host processing system;
a second memory configured to hold a secondary image; and
a display refresh circuitry configured to:
update said display screen with ones of said images processed by said host processing system, and
in response to said user input and without intervention by said host processing system following said detection of said user input:
generate a blended image comprising at least portions of said primary image and said secondary image, and
update said display screen with said blended image, such that said generating a blended image and updating said display screen with said blended image reduces processing by said host processing system by allowing said host processing system to remain in said low power state while said display refresh circuitry generates said blended image and updates said display screen with said blended image,
wherein said host processing system is configured to:
provide, in response to an initiation of a drag operation, an image to be dragged in said drag operation as said secondary image, so that said blended image comprises a movement of said image to be dragged with respect to said primary image, and
update, in response to a termination of said drag operation, said primary image to include a copy of said image to be dragged at a location defined by said drag operation.

7. The touch screen control system of claim 6, wherein said touch screen control system is further configured to modify said secondary image in response to said user input without requiring intervention by said host processing system.

8. The touch screen control system of claim 6, wherein said second memory is smaller in memory capacity than said first memory.

9. The touch screen control system of claim 6, wherein said second memory is further configured to hold a tertiary image simultaneously with said secondary image.

10. The touch screen control system of claim 6, wherein said display refresh circuitry is configured to generate said blended image by:
blending said secondary image at a first location with respect to said primary image, and
blending a tertiary image or a second copy of said secondary image at a second location with respect to said primary image.

11. The touch screen control system of claim 6, wherein said display refresh circuitry is configured to generate said blended image by:
blending said secondary image at a location with respect to said primary image, wherein said location with respect to said primary image is based on at least one of a position and a motion of said user input.

12. A display control circuitry comprising:
a first memory configured to hold a primary image for display on a display screen;
a second memory configured to hold a secondary image for display on said display screen; and
display refresh circuitry configured to:
update said display screen with ones of said images processed by and received from a host processing system; and
in response to user input detected in a sensing region of a touch sensor, without requiring intervention by said host processing system, and following said host processing system entering a low power mode based on detection of said user input and without requiring intervention by said host processing system: generate a blended image comprising said primary image and said secondary image and update said display screen with said blended image, wherein said sensing region of said touch screen overlaps with said active area of said display screen, such that said generating a blended image and updating said display screen with said blended image reduces processing by said host processing system by allowing said host processing system to remain in said low power state while said display refresh circuitry generates said blended image and updates said display screen with said blended image,
wherein said host processing system is configured to:
provide, in response to an initiation of a drag operation, an image to be dragged in said drag operation as said secondary image, so that said blended image comprises a movement of said image to be dragged with respect to said primary image, and update, in response to a termination of said drag operation, said primary image to include a copy of said image to be dragged at a location defined by said drag operation.

13. The display control circuitry of claim 12, wherein said second memory is smaller in memory capacity than said first memory.

14. The display control circuitry of claim 12, wherein said display refresh circuitry is configured to generate said blended image by:
blending said secondary image at a location with respect to said primary image, wherein said location with respect to said primary image is based on at least one of a position and a motion of said user input.

15. The display control circuitry of claim 12, wherein said user input comprises input by a plurality of input objects, and wherein said display refresh circuitry is configured to generate said blended image by:
blending said secondary image at a first location with respect to said primary image, said first location associated with a position of a first input object of said plurality of input objects, and
blending a tertiary image or a second copy of said secondary image at a second location with respect to said primary image, said second location associated with a position of a second input object of said plurality of input objects.

16. A processor-implemented method for operating a touch screen control system to display images on a display screen, said method comprising:
processing initiation of a drag operation based on said user input;
receiving, as said secondary image, an image to be dragged in said drag operation, such that said blended image comprises a movement of said image to be dragged with respect to said primary image;
processing termination of said drag operation based said user input; and
receiving another primary image held in said first memory, wherein said another primary image includes said image to be dragged at a location reflective of said drag operation;
updating said display screen with ones of said images processed by and received from a host processing system, wherein said host processing system is configured for primary processing of said images for display on said display screen and following said host processing system entering a low power mode based on detection of said user input;
holding said primary image received from said host processing system in a first memory;
holding said secondary image in a second memory; and
in response to sensing user input in a sensing region overlapping an active area of said display screen:
autonomously generating said blended image comprising said primary image and said secondary image; and
autonomously updating said display screen with said blended image, such that said generating a blended image and updating said display screen with said blended image reduces processing by said host processing system by allowing said host processing system to remain in said low power state while blended image is generated and said display screen is updated with said blended image.

17. The processor-implemented method of claim 16, further comprising:
receiving said secondary image from said host processing system.

18. The processor-implemented method of claim 16, further comprising holding a tertiary image in said secondary memory simultaneously with said holding said secondary image, wherein said generating said blended image comprises:
blending said primary image, said secondary image, and said tertiary image.

19. The processor-implemented method of claim 16, further comprising
holding a tertiary image in said secondary memory simultaneously with said holding said secondary image, wherein said generating said blended image comprises:
selecting said secondary image in response to said sensing said user input.

20. The processor-implemented method of claim 16, further comprising:
determining said user input comprises a sequence of user input operations;
generating additional blended images and updating said display screen with said additional blended images without intervention by said host processing system, in response to said sequence of user input operations;
determining an end of said sequence of user input operations; and
providing an indication to said host processing system of said sequence of user input operations, in response to said end.

21. The processor-implemented method of claim 16, further comprising:
initiating an independent blending function in response to a first signal from said host processing system, wherein said touch screen control system generates blended images without requiring intervention by said host processing system for said independent blending function; and
terminating said independent blending function in response to a second signal from said host processing system.

22. The processor-implemented method of claim 16, wherein said primary image comprises an image of a virtual keyboard, and wherein said second memory contains a plurality of key images associated with said virtual keyboard, said method further comprising:
determining user actuation of a key of said virtual keyboard based on said user input, and
selecting a key image of said plurality of key images as said secondary image based on said determining, such that said blended image shows said virtual keyboard with actuation of said key.

23. The processor-implemented method of claim 16, further comprising:
modifying said secondary image in response to said user input, without intervention by said host processing system.

24. The processor-implemented method of claim 23, wherein said modifying said secondary image comprises:
adjusting said secondary image such that said blended image comprises inking associated with a movement of said user input.

25. The processor-implemented method of claim 16, wherein said user input comprises input by a plurality of input objects in said sensing region, and wherein said generating said blended image comprises:

blending said secondary image at a first location relative to said primary image, wherein said first location is based on a first position of a first input object of said plurality of input objects, and blending a tertiary image or a second copy of said secondary image at a second location relative to said primary image, wherein said second location is based on a second position of a second input object of said plurality of input objects.

26. The processor-implemented method of claim 16, wherein said second memory is configured to hold a plurality of images, each image of said plurality of images associated with at least one gesture of a plurality of user input gestures, said method further comprising:

recognizing said user input as comprising a first gesture of said plurality of user input gestures; and selecting as said secondary image an image of said plurality of images associated with said first gesture, such that said blended image provides visual feedback of said recognizing.

27. The processor-implemented method of claim 16, wherein said autonomously generating and autonomously updating is performed at a faster rate than a maximum image data update rate, wherein said maximum image data update rate is a fastest rate at which said processing system can update said primary image or said secondary image.

* * * * *